(12) United States Patent
Shanmugasundram et al.

(10) Patent No.: US 7,698,012 B2
(45) Date of Patent: Apr. 13, 2010

(54) DYNAMIC METROLOGY SCHEMES AND SAMPLING SCHEMES FOR ADVANCED PROCESS CONTROL IN SEMICONDUCTOR PROCESSING

(75) Inventors: Arulkumar P. Shanmugasundram, Sunnyvale, CA (US); Alexander T. Schwarm, Austin, TX (US)

(73) Assignee: Applied Materials, Inc., Santa Clara, CA (US)

(*) Notice: Subject to any disclaimer, the term of this patent is extended or adjusted under 35 U.S.C. 154(b) by 1239 days.

(21) Appl. No.: 10/135,451

(22) Filed: May 1, 2002

(65) Prior Publication Data
US 2002/0193899 A1 Dec. 19, 2002

Related U.S. Application Data

(60) Provisional application No. 60/322,459, filed on Sep. 17, 2001, provisional application No. 60/298,878, filed on Jun. 19, 2001.

(51) Int. Cl.
*G06F 19/00* (2006.01)
(52) U.S. Cl. .................. 700/110; 700/121; 702/83
(58) Field of Classification Search .......... 702/83; 700/108, 121, 109, 110

See application file for complete search history.

(56) References Cited

U.S. PATENT DOCUMENTS 3,205,485 A    9/1965 Noltingk (Continued)

FOREIGN PATENT DOCUMENTS

CA    2050247    8/1991

(Continued)

OTHER PUBLICATIONS

Kuo et al., "Effective In-Line Defect monitoring with Variable Wafer Area Coverage", IEEE.SEMI Advanced Semiconductor Manufacturing Conference, 1997.*

(Continued)

*Primary Examiner*—Ryan A Jarrett
(74) *Attorney, Agent, or Firm*—Blakely, Sokoloff, Taylor & Zafman, LLP

(57) ABSTRACT

Systems, methods and mediums are provided for dynamic adjustment of sampling plans in connection with a wafer (or other device) to be measured. A sampling plan provides information on specific measure points within a die, a die being the section on the wafer that will eventually become a single chip after processing. There are specified points within the die that are candidates for measuring. The stored die map information may be retrieved and translated to determine the available points for measurement on the wafer.

The invention adjusts the frequency and/or spatial resolution of measurements when one or more events occur that are likely to indicate an internal or external change affecting the manufacturing process or results. The increase in measurements and possible corresponding decrease in processing occur on an as-needed basis. The dynamic metrology plan adjusts the spatial resolution of sampling within-wafer by adding, subtracting or replacing candidate points from the sampling plan, in response to certain events which suggest that additional or different measurements of the wafer may be desirable. Where there are provided a number of candidate points in the die map in the area to which points are to be added, subtracted, or replaced, the system can select among the points. Further, the invention may be used in connection with adjusting the frequency of wafer-to-wafer measurements.

56 Claims, 6 Drawing Sheets

U.S. PATENT DOCUMENTS

| | | | |
|---|---|---|---|
| 3,229,198 A | 1/1966 | Libby | |
| 3,767,900 A | 10/1973 | Chao et al. | |
| 3,920,965 A | 11/1975 | Sohrwardy | |
| 4,000,458 A | 12/1976 | Miller et al. | |
| 4,207,520 A | 6/1980 | Flora et al. | |
| 4,209,744 A | 6/1980 | Gerasimov et al. | |
| 4,302,721 A | 11/1981 | Urbanek et al. | |
| 4,368,510 A | 1/1983 | Anderson | |
| 4,609,870 A | 9/1986 | Lale et al. | |
| 4,616,308 A | 10/1986 | Morshedi et al. | |
| 4,663,703 A | 5/1987 | Axelby et al. | |
| 4,698,766 A | 10/1987 | Entwistle et al. | |
| 4,717,596 A | 1/1988 | Barbee et al. | |
| 4,750,141 A | 6/1988 | Judell et al. | |
| 4,755,753 A | 7/1988 | Chern | |
| 4,757,259 A | 7/1988 | Charpentier | |
| 4,796,194 A | 1/1989 | Atherton | |
| 4,901,218 A | 2/1990 | Cornwell | |
| 4,938,600 A | 7/1990 | Into | |
| 4,957,605 A | 9/1990 | Hurwitt et al. | |
| 4,967,381 A | 10/1990 | Lane et al. | |
| 5,089,970 A | 2/1992 | Lee et al. | |
| 5,108,570 A | 4/1992 | Wang | |
| 5,208,765 A | 5/1993 | Turnbull | |
| 5,220,517 A | 6/1993 | Sierk et al. | |
| 5,226,118 A | 7/1993 | Baker et al. | |
| 5,231,585 A | 7/1993 | Kobayashi et al. | |
| 5,236,868 A | 8/1993 | Nulman | |
| 5,240,552 A | 8/1993 | Yu et al. | |
| 5,260,868 A | 11/1993 | Gupta et al. | |
| 5,270,222 A | 12/1993 | Moslehi | |
| 5,283,141 A | 2/1994 | Yoon et al. | |
| 5,295,242 A | 3/1994 | Mashruwala et al. | |
| 5,309,221 A | 5/1994 | Fischer et al. | |
| 5,329,463 A | 7/1994 | Sierk et al. | |
| 5,338,630 A | 8/1994 | Yoon et al. | |
| 5,347,446 A | 9/1994 | Iino et al. | |
| 5,367,624 A | 11/1994 | Cooper | |
| 5,369,544 A | 11/1994 | Mastrangelo | |
| 5,375,064 A | 12/1994 | Bollinger | |
| 5,398,336 A | 3/1995 | Tantry et al. | |
| 5,402,367 A | 3/1995 | Sullivan et al. | |
| 5,408,405 A | 4/1995 | Mozumder et al. | |
| 5,410,473 A | 4/1995 | Kaneko et al. | |
| 5,420,796 A | 5/1995 | Weling et al. | |
| 5,427,878 A | 6/1995 | Corliss | |
| 5,444,837 A | 8/1995 | Bomans et al. | |
| 5,469,361 A | 11/1995 | Moyne | |
| 5,485,082 A | 1/1996 | Wisspeintner et al. | |
| 5,490,097 A | 2/1996 | Swenson et al. | |
| 5,495,417 A | 2/1996 | Fuduka et al. | |
| 5,497,316 A | 3/1996 | Sierk et al. | |
| 5,497,381 A | 3/1996 | O'Donoghue et al. | |
| 5,503,707 A | 4/1996 | Maung et al. | |
| 5,508,947 A | 4/1996 | Sierk et al. | |
| 5,511,005 A | 4/1996 | Abbe et al. | |
| 5,519,605 A | 5/1996 | Cawlfield | |
| 5,525,808 A | 6/1996 | Irie et al. | |
| 5,526,293 A | 6/1996 | Mozumder et al. | |
| 5,534,289 A | 7/1996 | Bilder et al. | |
| 5,535,128 A | 7/1996 | Laube et al. | |
| 5,541,510 A | 7/1996 | Danielson | |
| 5,546,179 A | 8/1996 | Cheng | |
| 5,546,312 A | 8/1996 | Mozumder et al. | |
| 5,553,195 A | 9/1996 | Meijer | |
| 5,586,039 A | 12/1996 | Hirsch et al. | |
| 5,599,423 A | 2/1997 | Parker et al. | |
| 5,602,492 A | 2/1997 | Cresswell et al. | |
| 5,603,707 A | 2/1997 | Trombetta et al. | |
| 5,617,023 A | 4/1997 | Skalski | |
| 5,627,083 A | 5/1997 | Tounai | |
| 5,629,216 A | 5/1997 | Wijaranakula et al. | |
| 5,642,296 A | 6/1997 | Saxena | |
| 5,646,870 A | 7/1997 | Krivokapic et al. | |
| 5,649,169 A | 7/1997 | Berezin et al. | |
| 5,654,903 A | 8/1997 | Reitman et al. | |
| 5,655,951 A | 8/1997 | Meikle et al. | |
| 5,657,254 A | 8/1997 | Sierk et al. | |
| 5,661,669 A | 8/1997 | Mozumder et al. | |
| 5,663,797 A | 9/1997 | Sandhu | |
| 5,664,987 A | 9/1997 | Renteln | |
| 5,664,990 A | 9/1997 | Adams et al. | |
| 5,665,199 A | 9/1997 | Sahota et al. | |
| 5,665,214 A | 9/1997 | Iturralde | |
| 5,666,297 A | 9/1997 | Britt et al. | |
| 5,667,424 A | 9/1997 | Pan | |
| 5,674,787 A | 10/1997 | Zhao et al. | |
| 5,694,325 A | 12/1997 | Fukuda et al. | |
| 5,695,810 A | 12/1997 | Dubin et al. | |
| 5,698,989 A | 12/1997 | Nulman | |
| 5,711,843 A | 1/1998 | Jahns | |
| 5,719,495 A | 2/1998 | Moslehi | |
| 5,719,796 A | 2/1998 | Chen | |
| 5,733,171 A | 3/1998 | Allen et al. | |
| 5,735,055 A | 4/1998 | Hochbein et al. | |
| 5,740,429 A | 4/1998 | Wang et al. | |
| 5,751,582 A | 5/1998 | Saxena et al. | |
| 5,754,297 A | 5/1998 | Nulman | |
| 5,761,064 A | 6/1998 | La et al. | |
| 5,761,065 A | 6/1998 | Kittler et al. | |
| 5,764,543 A | 6/1998 | Kennedy | |
| 5,777,901 A | 7/1998 | Berezin et al. | |
| 5,787,021 A | 7/1998 | Samaha | |
| 5,787,269 A | 7/1998 | Hyodo | |
| 5,808,303 A | 9/1998 | Schlagheck et al. | |
| 5,812,407 A | 9/1998 | Sato et al. | |
| 5,823,854 A | 10/1998 | Chen | |
| 5,824,599 A | 10/1998 | Schacham-Diamand et al. | |
| 5,825,356 A | 10/1998 | Habib et al. | |
| 5,825,913 A | 10/1998 | Rostami et al. | |
| 5,828,778 A | 10/1998 | Hagi et al. | |
| 5,831,851 A | 11/1998 | Eastburn et al. | |
| 5,832,224 A | 11/1998 | Fehskens et al. | |
| 5,838,595 A | 11/1998 | Sullivan et al. | |
| 5,838,951 A | 11/1998 | Song | |
| 5,844,554 A | 12/1998 | Geller et al. | |
| 5,857,258 A | 1/1999 | Penzes et al. | |
| 5,859,777 A | 1/1999 | Yokoyama et al. | |
| 5,859,964 A | 1/1999 | Wang et al. | |
| 5,859,975 A | 1/1999 | Brewer et al. | |
| 5,862,054 A | 1/1999 | Li | |
| 5,863,807 A | 1/1999 | Jang et al. | |
| 5,867,389 A | 2/1999 | Hamada et al. | |
| 5,870,306 A | 2/1999 | Harada | |
| 5,871,805 A | 2/1999 | Lemelson | |
| 5,883,437 A | 3/1999 | Maruyama et al. | |
| 5,889,991 A | 3/1999 | Consolatti et al. | |
| 5,901,313 A | 5/1999 | Wolf et al. | |
| 5,903,455 A | 5/1999 | Sharpe, Jr. et al. | |
| 5,910,011 A | 6/1999 | Cruse | |
| 5,910,846 A | 6/1999 | Sandhu | |
| 5,912,678 A | 6/1999 | Saxena et al. | |
| 5,916,016 A | 6/1999 | Bothra | |
| 5,923,553 A | 7/1999 | Yi | |
| 5,926,690 A | 7/1999 | Toprac et al. | |
| 5,930,138 A | 7/1999 | Lin et al. | |
| 5,940,300 A | 8/1999 | Ozaki | |
| 5,943,237 A | 8/1999 | Van Boxem | |
| 5,943,550 A | 8/1999 | Fulford, Jr. et al. | |
| 5,960,185 A | 9/1999 | Nguyen | |
| 5,960,214 A | 9/1999 | Sharpe, Jr. et al. | |
| 5,961,369 A | 10/1999 | Bartels et al. | |
| 5,963,881 A | 10/1999 | Kahn et al. | |
| 5,975,994 A | 11/1999 | Sandhu et al. | |

| | | | | | | |
|---|---|---|---|---|---|---|
| 5,978,751 | A | 11/1999 | Pence et al. | 6,249,712 B1 | 6/2001 | Boiquaye |
| 5,982,920 | A | 11/1999 | Tobin, Jr. et al. | 6,252,412 B1 | 6/2001 | Talbot et al. |
| 6,002,989 | A | 12/1999 | Shiba et al. | 6,253,366 B1 | 6/2001 | Mutschler, III |
| 6,012,048 | A | 1/2000 | Gustin et al. | 6,259,160 B1 | 7/2001 | Lopatin et al. |
| 6,017,771 | A | 1/2000 | Yang et al. | 6,263,255 B1 | 7/2001 | Tan et al. |
| 6,036,349 | A | 3/2000 | Gombar | 6,268,270 B1 | 7/2001 | Scheid et al. |
| 6,037,664 | A | 3/2000 | Zhao et al. | 6,271,670 B1 | 8/2001 | Caffey |
| 6,041,263 | A | 3/2000 | Boston et al. | 6,276,989 B1 | 8/2001 | Campbell et al. |
| 6,041,270 | A | 3/2000 | Steffan et al. | 6,277,014 B1 | 8/2001 | Chen et al. |
| 6,054,379 | A | 4/2000 | Yau et al. | 6,278,899 B1 | 8/2001 | Piche et al. |
| 6,059,636 | A | 5/2000 | Inaba et al. | 6,280,289 B1 | 8/2001 | Wiswesser et al. |
| 6,064,759 | A | 5/2000 | Buckley et al. | 6,281,127 B1 | 8/2001 | Shue |
| 6,072,313 | A | 6/2000 | Li et al. | 6,284,622 B1 | 9/2001 | Campbell et al. |
| 6,074,443 | A | 6/2000 | Venkatesh et al. | 6,287,879 B1 | 9/2001 | Gonzales et al. |
| 6,074,517 | A | 6/2000 | Taravade | 6,290,572 B1 | 9/2001 | Hofmann |
| 6,077,412 | A | 6/2000 | Ting et al. | 6,291,367 B1 | 9/2001 | Kelkar |
| 6,078,845 | A | 6/2000 | Friedman | 6,292,708 B1 | 9/2001 | Allen et al. |
| 6,094,688 | A | 7/2000 | Mellen-Garnett et al. | 6,298,274 B1 | 10/2001 | Inoue |
| 6,096,649 | A | 8/2000 | Jang | 6,298,470 B1 | 10/2001 | Breiner et al. |
| 6,097,887 | A | 8/2000 | Hardikar et al. | 6,303,395 B1 | 10/2001 | Nulman |
| 6,100,195 | A | 8/2000 | Chan et al. | 6,304,999 B1 | 10/2001 | Toprac et al. |
| 6,108,092 | A | 8/2000 | Sandhu | 6,307,628 B1 | 10/2001 | Lu et al. |
| 6,111,634 | A | 8/2000 | Pecen et al. | 6,314,379 B1 | 11/2001 | Hu et al. |
| 6,112,130 | A | 8/2000 | Fukuda et al. | 6,317,643 B1 | 11/2001 | Dmochowski |
| 6,113,462 | A | 9/2000 | Yang | 6,320,655 B1 | 11/2001 | Matsushita et al. |
| 6,114,238 | A | 9/2000 | Liao | 6,324,481 B1 | 11/2001 | Atchison et al. |
| 6,123,983 | A | 9/2000 | Smith, Jr. et al. | 6,334,807 B1 | 1/2002 | Lebel et al. |
| 6,127,263 | A | 10/2000 | Parikh | 6,336,841 B1 | 1/2002 | Chang |
| 6,128,016 | A | 10/2000 | Coelho et al. | 6,339,727 B1 | 1/2002 | Ladd |
| 6,136,163 | A | 10/2000 | Cheung et al. | 6,340,602 B1 | 1/2002 | Johnson et al. |
| 6,141,660 | A | 10/2000 | Bach et al. | 6,345,288 B1 | 2/2002 | Reed et al. |
| 6,143,646 | A | 11/2000 | Wetzel | 6,345,315 B1 | 2/2002 | Mishra |
| 6,148,099 | A | 11/2000 | Lee et al. | 6,346,426 B1 | 2/2002 | Toprac et al. |
| 6,148,239 | A | 11/2000 | Funk et al. | 6,355,559 B1 | 3/2002 | Havemann et al. |
| 6,148,246 | A | 11/2000 | Kawazome | 6,360,133 B1 | 3/2002 | Campbell et al. |
| 6,150,270 | A | 11/2000 | Matsuda et al. | 6,360,184 B1 | 3/2002 | Jacquez |
| 6,157,864 | A | 12/2000 | Schwenke et al. | 6,363,294 B1 | 3/2002 | Coronel et al. |
| 6,159,073 | A | 12/2000 | Wiswesser et al. | 6,366,934 B1 | 4/2002 | Cheng et al. |
| 6,159,075 | A | 12/2000 | Zhang | 6,368,879 B1 | 4/2002 | Toprac |
| 6,159,644 | A | 12/2000 | Satoh et al. | 6,368,883 B1 | 4/2002 | Bode et al. |
| 6,161,054 | A | 12/2000 | Rosenthal et al. | 6,368,884 B1 | 4/2002 | Goodwin et al. |
| 6,169,931 | B1 | 1/2001 | Runnels | 6,379,980 B1 | 4/2002 | Toprac |
| 6,172,756 | B1 | 1/2001 | Chalmers et al. | 6,381,564 B1 | 4/2002 | Davis et al. |
| 6,173,240 | B1 | 1/2001 | Sepulveda et al. | 6,388,253 B1 | 5/2002 | Su |
| 6,175,777 | B1 | 1/2001 | Kim | 6,389,491 B1 | 5/2002 | Jacobson et al. |
| 6,178,390 | B1 | 1/2001 | Jun | 6,391,780 B1 | 5/2002 | Shih et al. |
| 6,181,013 | B1 | 1/2001 | Liu et al. | 6,395,152 B1 | 5/2002 | Wang |
| 6,183,345 | B1 | 2/2001 | Kamono et al. | 6,397,114 B1 | 5/2002 | Eryurek et al. |
| 6,185,324 | B1 | 2/2001 | Ishihara et al. | 6,400,162 B1 | 6/2002 | Mallory et al. |
| 6,191,864 | B1 | 2/2001 | Sandhu | 6,405,096 B1 | 6/2002 | Toprac et al. |
| 6,192,291 | B1 | 2/2001 | Kwon | 6,405,144 B1 | 6/2002 | Toprac et al. |
| 6,194,231 | B1 | 2/2001 | Ho-Cheng et al. | 6,417,014 B1 | 7/2002 | Lam et al. |
| 6,197,604 | B1 | 3/2001 | Miller et al. | 6,427,093 B1 | 7/2002 | Toprac |
| 6,204,165 | B1 | 3/2001 | Ghoshal | 6,432,728 B1 | 8/2002 | Tai et al. |
| 6,210,745 | B1 | 4/2001 | Gaughan et al. | 6,435,952 B1 | 8/2002 | Boyd et al. |
| 6,210,983 | B1 | 4/2001 | Atchison et al. | 6,438,438 B1 | 8/2002 | Takagi et al. |
| 6,211,094 | B1 | 4/2001 | Jun et al. | 6,440,295 B1 | 8/2002 | Wang |
| 6,212,961 | B1 | 4/2001 | Dvir | 6,442,496 B1 * | 8/2002 | Pasadyn et al. ............... 702/83 |
| 6,214,734 | B1 | 4/2001 | Bothra et al. | 6,449,524 B1 | 9/2002 | Miller et al. |
| 6,217,412 | B1 | 4/2001 | Campbell et al. | 6,455,415 B1 | 9/2002 | Lopatin et al. |
| 6,219,711 | B1 | 4/2001 | Chari | 6,455,937 B1 | 9/2002 | Cunningham |
| 6,222,936 | B1 | 4/2001 | Phan et al. | 6,465,263 B1 | 10/2002 | Coss, Jr. et al. |
| 6,226,563 | B1 | 5/2001 | Lim | 6,469,518 B1 * | 10/2002 | Davis et al. ............... 324/600 |
| 6,226,792 | B1 | 5/2001 | Goiffon et al. | 6,470,230 B1 | 10/2002 | Toprac et al. |
| 6,228,280 | B1 | 5/2001 | Li et al. | 6,477,432 B1 | 11/2002 | Chen et al. |
| 6,230,069 | B1 | 5/2001 | Campbell et al. | 6,479,902 B1 | 11/2002 | Lopatin et al. |
| 6,236,903 | B1 | 5/2001 | Kim et al. | 6,479,990 B2 | 11/2002 | Mednikov et al. |
| 6,237,050 | B1 | 5/2001 | Kim et al. | 6,482,660 B2 | 11/2002 | Conchieri et al. |
| 6,240,330 | B1 | 5/2001 | Kurtzberg et al. | 6,484,064 B1 | 11/2002 | Campbell |
| 6,240,331 | B1 | 5/2001 | Yun | 6,486,492 B1 | 11/2002 | Su |
| 6,245,581 | B1 | 6/2001 | Bonser et al. | 6,492,281 B1 | 12/2002 | Song et al. |
| 6,246,972 | B1 | 6/2001 | Klimasauskas | 6,494,766 B1 | 12/2002 | Wiswesser et al. |
| 6,248,602 | B1 | 6/2001 | Bode et al. | 6,495,452 B1 | 12/2002 | Shih |

| | | |
|---|---|---|
| 6,503,839 B2 | 1/2003 | Gonzales et al. |
| 6,515,368 B1 | 2/2003 | Lopatin et al. |
| 6,517,413 B1 | 2/2003 | Hu et al. |
| 6,517,414 B1 | 2/2003 | Tobin et al. |
| 6,528,409 B1 | 3/2003 | Lopatin et al. |
| 6,529,789 B1 | 3/2003 | Campbell et al. |
| 6,532,555 B1 | 3/2003 | Miller et al. |
| 6,535,783 B1 | 3/2003 | Miller et al. |
| 6,537,912 B1 | 3/2003 | Agarwal |
| 6,540,591 B1 | 4/2003 | Pasadyn et al. |
| 6,541,401 B1 | 4/2003 | Herner et al. |
| 6,546,508 B1 | 4/2003 | Sonderman et al. |
| 6,556,881 B1 | 4/2003 | Miller |
| 6,560,504 B1 | 5/2003 | Goodwin et al. |
| 6,563,308 B2 | 5/2003 | Nagano et al. |
| 6,567,717 B2 | 5/2003 | Krivokapic et al. |
| 6,577,914 B1 | 6/2003 | Bode |
| 6,580,958 B1 | 6/2003 | Takano |
| 6,582,277 B2 | 6/2003 | Korovin |
| 6,587,744 B1 | 7/2003 | Stoddard et al. |
| 6,590,179 B2 | 7/2003 | Tanaka et al. |
| 6,604,012 B1 | 8/2003 | Cho et al. |
| 6,605,549 B2 | 8/2003 | Leu et al. |
| 6,607,976 B2 | 8/2003 | Chen et al. |
| 6,609,946 B1 | 8/2003 | Tran |
| 6,616,513 B1 | 9/2003 | Osterheld |
| 6,618,692 B2 | 9/2003 | Takahashi et al. |
| 6,624,075 B1 | 9/2003 | Lopatin et al. |
| 6,625,497 B2 | 9/2003 | Fairbairn et al. |
| 6,630,741 B1 | 10/2003 | Lopatin et al. |
| 6,640,151 B1 | 10/2003 | Somekh et al. |
| 6,652,355 B2 | 11/2003 | Wiswesser et al. |
| 6,660,633 B1 | 12/2003 | Lopatin et al. |
| 6,669,782 B1 | 12/2003 | Thakur |
| 6,678,570 B1 | 1/2004 | Pasadyn et al. |
| 6,708,074 B1 | 3/2004 | Chi et al. |
| 6,708,075 B2 | 3/2004 | Sonderman et al. |
| 6,725,402 B1 | 4/2004 | Coss, Jr. et al. |
| 6,728,587 B2 | 4/2004 | Goldman et al. |
| 6,735,492 B2 | 5/2004 | Conrad et al. |
| 6,751,518 B1 | 6/2004 | Sonderman et al. |
| 6,774,998 B1 | 8/2004 | Wright et al. |
| 6,913,938 B2 | 7/2005 | Shanmugasundram et al. |
| 6,988,017 B2 * | 1/2006 | Pasadyn et al. ............. 700/121 |
| 7,160,739 B2 | 1/2007 | Shanmugasundram et al. |
| 2001/0001755 A1 | 5/2001 | Sandhu et al. |
| 2001/0003084 A1 | 6/2001 | Finarov |
| 2001/0006873 A1 | 7/2001 | Moore |
| 2001/0030366 A1 | 10/2001 | Nakano et al. |
| 2001/0039462 A1 | 11/2001 | Mendez et al. |
| 2001/0040997 A1 | 11/2001 | Tsap et al. |
| 2001/0042690 A1 | 11/2001 | Talieh |
| 2001/0044667 A1 | 11/2001 | Nakano et al. |
| 2002/0032499 A1 | 3/2002 | Wilson et al. |
| 2002/0058460 A1 | 5/2002 | Lee et al. |
| 2002/0070126 A1 | 6/2002 | Sato et al. |
| 2002/0077031 A1 | 6/2002 | Johansson et al. |
| 2002/0081951 A1 | 6/2002 | Boyd et al. |
| 2002/0089676 A1 | 7/2002 | Pecen et al. |
| 2002/0102853 A1 | 8/2002 | Li et al. |
| 2002/0107599 A1 | 8/2002 | Patel et al. |
| 2002/0107604 A1 | 8/2002 | Riley et al. |
| 2002/0113039 A1 | 8/2002 | Mok et al. |
| 2002/0127950 A1 | 9/2002 | Hirose et al. |
| 2002/0128805 A1 | 9/2002 | Goldman et al. |
| 2002/0149359 A1 | 10/2002 | Crouzen et al. |
| 2002/0165636 A1 | 11/2002 | Hasan |
| 2002/0183986 A1 | 12/2002 | Stewart et al. |
| 2002/0185658 A1 | 12/2002 | Inoue et al. |
| 2002/0193899 A1 | 12/2002 | Shanmugasundram et al. |
| 2002/0193902 A1 | 12/2002 | Shanmugasundram et al. |
| 2002/0197745 A1 | 12/2002 | Shanmugasundram et al. |
| 2002/0197934 A1 | 12/2002 | Paik |
| 2002/0199082 A1 | 12/2002 | Shanmugasundram et al. |
| 2003/0017256 A1 | 1/2003 | Shimane |
| 2003/0020909 A1 | 1/2003 | Adams et al. |
| 2003/0020928 A1 | 1/2003 | Ritzdorf et al. |
| 2003/0154062 A1 | 8/2003 | Daft et al. |
| 2005/0221514 A1 | 10/2005 | Pasadyn et al. |
| 2007/0102116 A1 | 5/2007 | Shanmugasundram et al. |

FOREIGN PATENT DOCUMENTS

| | | |
|---|---|---|
| CA | 2165847 | 8/1991 |
| CA | 2194855 | 8/1991 |
| EP | 0 397 924 A1 | 11/1990 |
| EP | 0 621 522 A2 | 10/1994 |
| EP | 0 747 795 A2 | 12/1996 |
| EP | 0 869 652 | 10/1998 |
| EP | 0 877 308 A2 | 11/1998 |
| EP | 0 881 040 A2 | 12/1998 |
| EP | 0 895 145 A1 | 2/1999 |
| EP | 0 910 123 | 4/1999 |
| EP | 0 932 194 | 7/1999 |
| EP | 0 932 195 A1 | 7/1999 |
| EP | 1 066 925 A2 | 1/2001 |
| EP | 1 067 757 | 1/2001 |
| EP | 1 071 128 | 1/2001 |
| EP | 1067757 | 1/2001 |
| EP | 1 083 470 A2 | 3/2001 |
| EP | 1 092 505 A2 | 4/2001 |
| EP | 1072967 A3 | 11/2001 |
| EP | 1 182 526 A2 | 2/2002 |
| GB | 2 347 885 A | 9/2000 |
| GB | 2 365 215 A | 2/2002 |
| JP | 61-66104 | 4/1986 |
| JP | 61-171147 | 8/1986 |
| JP | 01-283934 | 11/1989 |
| JP | 3-202710 | 9/1991 |
| JP | 05-151231 | 6/1993 |
| JP | 05-5136098 | 7/1993 |
| JP | 05-5190457 | 7/1993 |
| JP | 05-216896 | 8/1993 |
| JP | 05-266029 | 10/1993 |
| JP | 06-110894 | 4/1994 |
| JP | 06-176994 | 6/1994 |
| JP | 06-184434 | 7/1994 |
| JP | 06-252236 | 9/1994 |
| JP | 06-260380 | 9/1994 |
| JP | 8-23166 | 1/1996 |
| JP | 08-50161 | 2/1996 |
| JP | 08-149583 | 6/1996 |
| JP | 08-304023 | 11/1996 |
| JP | 09-34535 | 2/1997 |
| JP | 9-246547 | 9/1997 |
| JP | 09-269294 | 10/1997 |
| JP | 10-34522 | 2/1998 |
| JP | 10-173029 | 6/1998 |
| JP | 11-67853 | 3/1999 |
| JP | 11-126816 | 5/1999 |
| JP | 11-135601 | 5/1999 |
| JP | 2000-183001 | 6/2000 |
| JP | 2001-76982 | 3/2001 |
| JP | 2001-284299 | 10/2001 |
| JP | 2001-305108 | 10/2001 |
| JP | 2002-9030 | 1/2002 |
| JP | 2002-343754 | 11/2002 |
| TW | 434103 | 5/2001 |
| TW | 436383 | 5/2001 |
| TW | 455938 | 9/2001 |
| TW | 455976 | 9/2001 |
| WO | WO 95/34866 | 12/1995 |
| WO | WO 98/05066 | 2/1998 |
| WO | WO 98/45090 | 10/1998 |
| WO | WO 99/09371 | 2/1999 |
| WO | WO 99/25520 | 5/1999 |

| | | |
|---|---|---|
| WO | WO 99/59200 | 11/1999 |
| WO | WO 00/00874 | 1/2000 |
| WO | WO 00/05759 | 2/2000 |
| WO | WO 00/35063 | 6/2000 |
| WO | WO 00/54325 | 9/2000 |
| WO | WO 00/79355 A1 | 12/2000 |
| WO | WO 01/11679 | 2/2001 |
| WO | WO 01/15865 A1 | 3/2001 |
| WO | WO 01/18623 | 3/2001 |
| WO | WO 01/25865 | 4/2001 |
| WO | WO 01/33277 | 5/2001 |
| WO | WO 01/33501 A1 | 5/2001 |
| WO | WO 01/52055 A3 | 7/2001 |
| WO | WO 01/52319 | 7/2001 |
| WO | WO 01/57823 A2 | 8/2001 |
| WO | WO 01/80306 | 10/2001 |
| WO | WO 02/17150 | 2/2002 |
| WO | WO 02/17150 A1 | 2/2002 |
| WO | WO 02/31613 A2 | 4/2002 |
| WO | WO 02/31613 A3 | 4/2002 |
| WO | WO 02/33737 A2 | 4/2002 |
| WO | WO 02/074491 | 9/2002 |
| WO | WO 02/103778 | 12/2002 |

OTHER PUBLICATIONS

M. McIntyre, R.K. Nurani, R. Akella. "Key Considerations in the Development of Defect Sampling Methodologies". ASMC 96 Proceedings, IEEE/SEMI 1996 (Nov. 1996): 81-85.*

W.W Kuo, Adaptive in-line Sampling Strategies for Semiconductors Manufacturing, ESRC 96-35, and CSM-35. Jan. 1997 (abstract only).*

R.K. Nurani and J.G. Shanthikumar. "The Impact of Lot-to-lot and Wafer-to-wafer Variations on SPC". IEE (1997):69-72.*

Dishon, G., D. Eylon, M. Finarov, and A. Shulman. "Dielectric CMP Advanced Process Control Based on Integrated Monitoring." Ltd. Rehoveth, Israel: Nova Measuring Instruments.

Feb. 1984. "Method and Apparatus of in Situ Measurement and Overlay Error Analysis for Correcting Step and Repeat Lithographic Cameras." *IBM Technical Disclosure Bulletin*, pp. 485-4859.

Oct. 1984. "Method to Characterize the Stability of a Step and Repeat Lithographic System." *IBM Technical Disclosure Bulletin*, pp. 2857-2860.

Runyan, W. R., and K. E. Bean. 1990. "Semiconductor Integrated Circuit Processing Technology." p. 48, Reading, Massachusetts: Addison-Wesley Publishing Company.

Zorich, Robert. 1991. *Handbook of Quality Integrated Circuit Manufacturing*. pp. 464-498 San Diego, California: Academic Press, Inc.

Rampalli, Prasad, Arakere Ramesh, and Nimish Shah. 1991. *CEPT—A Computer-Aided Manufacturing Application for Managing Equipment Reliability and Availability in the Semiconductor Industry*. New York, New Yor: IEEE.

Moyne, James R., Nauman Chaudhry, and Roland Telfeyan. 1995. "Adaptive Extensions to a Multi-Branch Run-to-Run Controller for Plasma Etching." *Journal of Vacuum Science and Technology*. Ann Arbor, Michigan: University of Michigan Display Technology Manufacturing Center.

Moyne, James, Roland Telfeyan, Arnon Hurwitz, and John Taylor. Aug. 1995. "A Process-Independent Run-to-Run Controller and Its Application to Chemical-Mechanical Planarization." *SEMI/IEEE Advanced Semiconductor Manufacturing Conference and Workshop*. Ann Arbor, Michigan: The University of Michigan, Electrical Engineering & Computer Science Center for Display Technology & Manufacturing.

Zhou, Zhen-Hong and Rafael Reif. Aug. 1995. "Epi-Film Thickness Measurements Using Emission Fourier Transform Infrared Spectroscopy—Part II: Real-Time in Situ Process Monitoring and Control." IEEE Transactions on Semiconductor Manufacturing, vol. 8, No. 3.

Telfeyan, Roland, James Moyne, Nauman chaudhry, James Pugmire, Scott Shellman, Duane Boning, William Moyne, Arnon Hurwitz, and John Taylor. Oct. 1995. "A Multi-Level Approach to the Control of a Chemical-Mechanical Planarization Process." Minneapolis, Minnesota: $42^{nd}$ National Symposium of the American Vacuum Society.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die and Wafer-level ILD Thickness Variation in CMP Processes." Washington, D.C.: International Electron Devices Meeting.

Schmid, Hans Albrecht. 1995. "Creating the Architecture of a Manufacturing Framework by Design Patterns." Austin, Texas: OOPSLA.

Dishon, G., M. Finarov, R. Kipper, J.W. Curry, T. Schraub, D. Trojan, $4^{th}$ Stambaugh, Y. Li and J. Ben-Jacob. Feb. 1996. "On-Line Integrated Metrology for CMP Processing." Santa Clara, California: VMIC Speciality Conferences, $1^{st}$ International CMP Planarization Conference.

Smith, Taber, Duane Boning, James Moyne, Arnon Hurwitz, and John Curry. Jun. 1996. "Compensating for CMP Pad Wear Using Run by Run Feedback Control." Santa Clara, California: VLSI Multilevel Interconnect Conference.

Boning, Duane, William Moyne, Taber Smith, James Moyne, Roland Telfeyan, Arnon Hurwitz, Scott Shellman, and John Taylor. Oct. 1996. "Run by Run Control of Chemical-Mechanical Polishing." *IEEE Trans. CPMT(C)*, vol. 19, No. 4, pp. 307-314.

SEMI. [1986] 1996. "Standard for Definition and Measurement of Equipment Reliability, availability, and Maintainability (RAM)." SEMI E10-96.

Van Zant, Peter. 1997. *Microchip Fabrication: A Practical Guide to Semiconductor Processing*. Third Edition, pp. 472-478. New York, New York: McGraw-Hill.

Campbell, W. Jarrett, and Anthony J. Toprac. Feb. 11-12, 1998. "Run-to-Run Control in Microelectronics Manufacturing." Advanced Micro Devises, TWMCC.

U.S. Appl. No. 09/363,966, filed Jul. 29, 1999, Arackaparambil et al., Computer Integrated manufacturing Techniques.

U.S. Appl. No. 09/469,227, filed Dec. 22, 1999, Somekh et al., Multi-Tool Control System, Method and Medium.

U.S. Appl. No. 09/619,044, filed Jul. 19, 2000, Yuan, System and Method of Exporting or Importing Object Data in a Manufacturing Execution System.

U.S. Appl. No. 09/637,620, filed Aug. 11, 2000, Chi et al., Generic Interface Builder.

U.S. Appl. No. 09/656,031, filed Sep. 6, 2000, Chi et al., Dispatching Component for Associating Manufacturing Facility Service Requestors with Service Providers.

U.S. Appl. No. 09/655,542, filed Sep. 6, 2000, Yuan, System, Method and Medium for Defining Palettes to Transform an Application Program Interface for a Service.

Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." Automatica, vol. 36, pp. 1567-1603, 2000.

Moyne, James, and John Curry. Jun. 1998. "A Fully Automated Chemical-Mechanical Planarization Process." Santa Clara, California: VLSI Multilevel Interconnection (V-MIC) Conference.

SEMI. Jul. 1998. *New Standard: Provisional Specification for CIM Framework Domain Architecture*. Mountain View, California: SEMI Standards. SEMI Draft Doc. 2817.

Consilium. Aug. 1998. *Quality Management Component: QMC™ and QMC-Link™ Overview*. Mountain view, California: Consilium, Inc.

Chemali, Chadi El, James Moyne, Kareemullah Khan, Rock Nadeau, Paul Smith, John Colt, Jonathan Chapple-Sokol, and Tarun Parikh. Nov. 1998. "Multizone Uniformity Control of a CMP Process Utilizing a Pre and Post-Measurement Strategy." Seattle, Washington: Semetech Symposium.

Consilium. 1998. *FAB300™*. Mountain View, California: Consilium, Inc.

Khan, Kareemullah, Victor Solakhain, Anthony Ricci, Tier Gu, and James Moyne. 1998. "Run-to-Run Control of ITO Deposition Process." Ann Arbor, Michigan.

U.S. Appl. No. 09/725,908, filed Nov. 30, 2000, Chi et al., Dynamic Subject Information Generation in Message Services of Distributed Object Systems.

U.S. Appl. No. 09/800,980, filed Mar. 8, 2001, Hawkins et al., Dynamic and Extensible Task Guide.

U.S. Appl. No. 09/811,667, filed Mar. 20, 2001, Yuan et al., Fault Tolerand and Automated Computer Software Workflow.

U.S. Appl. No. 09/927,444, filed Aug. 13, 2001, Ward et al., Dynamic Control of Wafer Processing Paths in Semiconductor Manufacturing Processes.

U.S. Appl. No. 09/928,473, filed Aug. 14, 2001, Koh, Tool Services Layer for Providing Tool Service Functions in Conjunction with Tool Functions.

U.S. Appl. No. 09/928,474, filed Aug. 14, 2001, Krishnamurthy et al., Experiment Management System, Method and Medium.

Consilium. Jan. 1999. "FAB300™: Consilium's Next Generation MES Solution of Software and Services which Control and Automate Real-Time FAB Operations." www.consilium.com/products/fab300_page.htm#FAB300 Introduction.

Baliga, John. Jul. 1999. "Advanced Process Control: Soon to be a Must." Cahners Semiconductor International. www.semiconductor.net/semiconductor/issues/issues/1999/jul99/docs/feature1.asp.

Consilium. Jul. 1999. "Increasing Overall Equipment Effectiveness (OEE) in Fab Manufacturing by Implementing Cosnilum's Next-Generation Manufacturing Execution System—MES II." Semiconductor Fabtech Edition 10.

Consilium Corporate Brochure. Oct. 1999. www.consilium.com.

Moyne, James. Oct. 1999. "Advancements in CMP Process Automation and Control." Hawaii: (Invited paper and presentation to) Third International Symposium on Chemical Mechanical Polishing in IC Device Manufacturing: 196th Meeting of the Electrochemical Society.

Consilium. Nov. 1999. *FAB300™ Update*.

SEMI. 2000. "Provisional Specification for CIM Framework scheduling Component." San Jose, California. SEMI E105-1000.

Lee, Brian, Duane S. Boning, Winthrop Baylies, Noel Poduje, Pat Hester, Yong Xia, John Valley, Chris Koliopoulus, Dale Hetherington, HongJiang Sun, and Michael Lacy. Apr. 2001. "Wafer nanotopography Effects on CMP: Experimental Validation of Modeling Methods." San Francisco, California: Materials Research Society spring Meeting.

U.S. Appl. No. 09/943,383, filed Aug. 31, 2001, Shanmugasundram et al., In Situ Based Control of Semiconductor Processing Procedure.

U.S. Appl. No. 09/943,955, filed Aug. 31, 2001, Shanmugasundram et al., Feedback Control of a Chemical Mechanical Polishing Device Providing Manipulation of Removal Rate Profiles.

U.S. Appl. No. 09/998,372, filed Nov. 30, 2001, Paik, Control of Chemical Mechanical Polishing Pad Conditioner Directional Velocity to Improve Pad Life.

U.S. Appl. No. 09/998,384, filed Nov. 30, 2001, Paik, Feedforward and Feedback Control for Conditioning of Chemical Mechanical Polishing Pad.

U.S. Appl. No. 10/084,092, filed Feb. 28, 2002, Arackaparambil et al., Computer Integrated Manufacturing Techniques.

U.S. Appl. No. 10/100,184, filed Mar. 19, 2002, Al-Bayati et al., Method, System and Medium for Controlling Semiconductor Wafer Processes Using Critical Dimension Measurements.

U.S. Appl. No. 10/135,405, filed May, 1, 2002, Reiss et al., Integration of Fault Detection with Run-to-Run Control.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.news/9907/20.07.shtml.

Oct. 15, 2001. Search Report prepared by the Austrian Patent Office for Singapore Patent Application No. 200004286-1.

NovaScan 2020. Feb. 2002. "Superior Integrated Process Control for Emerging CMP High-End Applications.".

Johnson, Bob. Jun. 10, 2002. "Advanced Process Control Key to Moore's Law." Gartner, Inc.

Jul. 9, 2002. International Search Report prepared by the European Patent Office for PCT/US01/24910.

Jul. 29, 2002. International Search Report prepared by the European Patent Office for PCT/US01/27407.

Sonderman, Thomas. 2002. "APC as a Competitive manufacturing Technology: *AMD's Vision for 300mm*." AEC/APC.

Jul. 23, 2002. Communication Pursuant to Article 96(2) EPC for European Patent Application No. 00 115 577.9.

Oct. 15, 2002. International Search Report prepared by the European Patent Office for PCT/US02/19062.

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126-132.

Hu, Albert, He Du, Steve Wong, Peter Renteln, and Emanuel Sachs. 1994. "Application of Run by Run Controller to the Chemical-Mechanical Planarization Process." IEEE/CPMT International Electronics Manufacturing Technology Symposium. pp. 371-378.

Smith, Taber, Duane Boning, James Moyne, Arnon Hurwitz, and John Curry. Jun. 1996. "Compensating for CMP Pad Wear Using Run by Run Feedback Control." Proceedings of the Thirteenth International VLSI Multilevel Interconnection Conference. pp. 437-439.

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium. pp. 1-10.

Klein, Bruce. Jun. 1999. "Application Development: XML Makes Object Models More Useful." Informationweek. pp. 1A-6A.

Chemali, Chadi El, James Moyne, Kareemullah Khan, Rock Nadeau, Paul Smith, John Smith, John Colt, Jonathan Chapple-Sokol, and Tarun Parikh. Jul./Aug. 2000. "Multizone Uniformity Control of a Chemical Mechanical Polishing Process Utilizing a Pre- and Postmeasurement Strategy." J. Vac. sci. Technol. A, vol. 18(4). pp. 1287-1296. American Vacuum Society.

Jensen, Alan, Peter Renteln, Stephen Jew, Chris Raeder, and Patrick Cheung. Jun. 2001. "Empirical-Based Modeling for Control of CMP Removal Uniformity." Solid State Technology, vol. 44, No. 6, pp. 101-102, 104, 106. Cowan Publ. Corp.: Washington, D.C.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr./May 2002. "Advance Process Control Solutions for Semiconductor Manufacturing." IEEE/SEMI Advanced Semiconductor Manufacturing Conference. pp. 101-106.

Oct. 4, 2002. International Search Report from PCT/US01/22833.

Nov. 7, 2002. International Search Report from PCT/US02/19061.

Nov. 12, 2002. International Search Report from PCT/US02/19063.

Ostanin, Yu.Ya. Oct. 1981. "Optimization of Thickness Inspection of Electrically Conductive Single-Layer Coatings with Laid-on Eddy-Current Transducers (Abstract)." *Defektoskopiya*, vol. 17, No. 10, pp. 45-52. Moscow, USSR.

Feb. 1984. "Substrate Screening Process." *IBM Technical Disclosure Bulletin*, pp. 4824-4825.

Herrmann, D. 1988. "Temperature Errors and Ways of Elimination for Contactless Measurement of Shaft Vibrations (Abstract)." *Technisches Messen™*, vol. 55, No. 1, pp. 27-30. West Germany.

Lin, Kuang-Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216-229.

Chang, Norman H and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43-51.

Larrabee, G. B. May 1991. "The Intelligent Microelectronics Factory of the Future (Abstract)." *IEEE/SEMI International Semiconductor Manufacturing Science Symposium*, pp. 30-34. Burlingame, CA.

Burke, Peter A. Jun. 1991. "Semi-Empirical Modelling of SiO2 Chemical-Mechanical Polishing Planarization." *VMIC Conference, 1991 IEEE*, pp. 379-384. IEEE.

May 1992. "Laser Ablation Endpoint Detector." *IBM Technical Disclosure Bulletin*, pp. 333-334.

Spanos, Costas J., Hai-Fang Guo, Alan Miller, and Joanne Levine-Parrill. Nov. 1992. "Real-Time Statistical Process Control Using Tool Data." *IEEE Transactions on Semiconductor Manufacturing*, v. 5, .n. 4, pp. 308-318.

Feb. 1993. "Electroless Plating Scheme to Hermetically Seal Copper Features." *IBM Technical Disclosure Bulletin*, pp. 405-406.

Scarr, J. M. and J. K. Zelisse. Apr. 1993. "New Topology for Thickness Monitoring Eddy Current Sensors (Abstract)." *Proceedings of the 36th Annual Technical Conference*, Dallas, Texas.

Matsuyama, Akira and Jessi Niou. 1993. "A State-of-the-Art Automation System of an ASIC Wafer Fab in Japan." *IEEE/SEMI International Semiconductor Manufacturing Science Syposium*, pp. 42-47.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438-442.

Kurtzberg, Jerome M. and Menachem Levanoni. Jan. 1994. "ABC: A Better Control for Manufacturing." *IBM Journal of Research and Development*, v. 38, n. 1, pp. 11-30.

Mozumder, Purnendu K. and Gabriel G. Barna. Feb. 1994. "Statistical Feedback Control of a Plasma Etch Process." *IEEE Transactions on Semiconductor Manufacturing*, v.7, n. 1, pp. 1-11.

Muller-Heinzerling, Thomas, Ulrich Neu, Hans Georg Nurnberg, and Wolfgang May. Mar. 1994. "Recipe-Controlled Operation of Batch Processes with Batch X." *ATP Automatisierungstechnische Praxis*, vol. 36, No. 3, pp. 43-51.

Stoddard, K., P. Crouch, M. Kozicki, and K. Tsakalis. Jun.-Jul. 1994. "Application of Feedforward and Adaptive Feedback Control to Semiconductor Device Manufacturing (Abstract)." *Proceedings of 1994 American Control Conference—ACC '94*, vol. 1, pp. 892-896. Baltimore, Maryland.

Schaper, C. D., M. M. Moslehi, K. C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200-3209.

Tao, K. M., R. L Kosut, M. Ekblad, and G. Aral. Dec. 1994. "Feedforward Learning Applied to RTP of Semiconductor Wafers (Abstract)." *Proceedings of the 33rd IEEE Conference on Decision and Control*, . vol. 1, pp. 67-72. Lake Buena Vista, Florida.

Hu, Albert, He Du, Steve Wong, Peter Renteln, and Emmanuel Sachs. 1994. "Application of Run by Run Controller to the Chemical-Mechanical Planarization Process." *IEEE/CPMT International Electronics Manufacturing Technology Symposium*, pp. 371-378.

Spanos, C. J., S. Leang,'S.-Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3-17.

Leang, Sovarong, Shang-Yi Ma, John Thomson, Bart John Bombay, and Costas J. Spanos. May 1996. "A Control System for Photolithographic Sequences." *IEEE Transactions on Semiconductor Manufacturing*, vol. 9, No. 2.

Boning, Duane S., William P. Moyne, Taber H. Smith, James Moyne, Ronald Telfeyan, Arnon Hurwitz, Scott Shellinan, and John Taylor. Oct. 1996. "Run by Run Control of Chemical-Mechanical Polishing." *IEEE Transactions on Components, Packaging, and Manufacturing Technology—Part C*, vol. 19, No. 4, pp. 307-314.

Zhe, Ning, J. R. Moyne, T. Smith, D. Boning, E. Del Castillo, Yeh Jinn-Yi,. And Hurwitz. Nov. 1996. "A Comparative Analysis of Run-to-Run Control Algorithms in Semiconductor Manufacturing Industry (Abstract)." *IEEE/SEMI 1996 Advanced Semiconductor Manufacturing Conference Workshop*, pp. 375-381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229-1233. Kobe, Japan.

Fan, Jr-Min, Ruey-Shan Guo, Shi-Chung Chang, and Kian-Huei Lee. 1996. "Abnormal Tred Detection of Sequence-Disordered Data Using EWMA Method." *IEEE/SEMI Advanced Semiconductor Manufacturing Conference*, pp. 169-174.

Smith, Taber and Duane Boning. 1996. "A Self-Tuning EWMA Controller Utilizing Artificial Neural Function Approximation Techniques." *IEEE/CPMT International Electronics Manufacturing Technology Symposium*, pp. 355-363.

Guo, Ruey-Shan, Li-Shia Huang, Argon Chen, and Jin-Jung Chen. Oct. 1997. "A Cost-Effective Methodology for a Run-by-Run EWMA Controller." *6International Symposium on Semiconductor Manufacturing*, pp. 61-64.

Mullins, J. A., W. J. Campbell, and A. D. Stock. Oct. 1997. "An Evaluation of Model Predictive Control in Run-to-Run Processing in Semiconductor Manufacturing (Abstract)." *Proceedings of the SPIE—The International Society for Optical Engineering Conference*, vol. 3213, pp. 182-189.

Reitman, E. A., D. J. Friedman, and E. R. Lory. Nov. 1997. "Pre-Production Results Demonstrating Multiple-System Models for Yield Analysis (Abstract)." *IEEE Transactions on Semiconductor Manufacturing*, vol. 10, No. 4, pp. 469-481.

Durham, Jim and Myriam Roussel. 1997. "A Statistical Method for Correlating In-Line Defectivity to Probe Yield." *IEEE/SEMI Advanced Semiconductor Manufacturing Conference*, pp. 76-77.

Shindo, Wataru, Eric H. Wang, Ram Akella, and Andrzej J. Strojwas. 1997. "Excursion Detection and Source Isolation in Defect Inspection and Classification." $2^{nd}$ *International Workshop on Statistical Metrology*, pp. 90-93.

Jul. 1998. "Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3, pp. 217-224.

Fang, S. J., A. Barda, T. Janecko, W. Little, D. Outley, G. Hempel, S. Joshi, B. Morrison, G. B. Shinn, and M. Birang. 1998. "Control of Dielectric Chemical mechanical Polishing (CMP) Using and Interferometry Based endpoint Sensor." *International Proceedings of the IEEE Interconnect Technology Conference*, pp. 76-78.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67-69.

Boning, Duane S., Jerry Stefani, and Stephanie W. Butler. Feb. 1999. "Statistical Methods for Semiconductor Manufacturing." *Encyclopedia of Electrical Engineering, J. G. Webster, Ed.*

McIntosh, John. Mar. 1999. "Using CD-SEM Metrology in the Manufacture of Semiconductors (Abstract)." *JOM*, vol. 51, No. 3, pp. 38-39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164-166.

Meckl, P. H. And K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725-729. Kohala Coast, HI.

Khan, K., C. El Chemali, J. Moyne, J. Chapple-Sokol, R. Nadeau, P. Smith, C., and T. Parikh. Oct. 1999: "Yield Improvement at the Contact Process Through Run-to-Run Control (Abstract)." $24^{th}$ *IEEE/CPMT Electronics Manufacturing Technology Symposium* pp. 258/263.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." *IEEE Transactions on Semiconductor Manufacturing*, vol. 12, No. 4.

Nov. 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Edgar, T. F., W. J. Campbell, and C. Bode. Dec. 1999. "Model-Based Control in Microelectronics Manufacturing." *Proceedings of the 38th IEEE Conference on Decision and Control*, Phoenix, Arizona, vol. 4, pp. 4185-4191.

Meckl, P. H. and K. Umemoto. Apr. 2000. "Achieving Fast Motions by Using shaped Reference Inputs [Semiconductor manufacturing Machine] (Abstract)." *NEC Research and Development*, vol. 41, No. 2, pp. 232-237.

Oechsner, R., T. Tschaftary, S. Sommer, L. Pfitzner, H. Ryssel, H. Gerath, C. Baier, and M. hafner. sep. 2000. "Feed-forward Control for a Lithography/Etch Sequence (Abstract)." *Proceedings of the SPIE—The International Society for Optical Engineering Conference*, vol. 4182, pp. 31-39.

Cheung, Robin. Oct. 18, 2000. "Copper Interconnect Technology." *AVS/CMP User Group Meeting*, Santa Clara, CA.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995-1000. St. Louis, Missouri.

ACM Research Inc. 2000. "Advanced Copper Metallization for 0.13 to 0.05 μm & Beyond." <http://acmrc.com/press/ACM-ECP-brochure.pdf>.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437-443.

Chen, Argon and Ruey-Shan Guo. Feb. 2001. "Age-Based Double EWMA Controller and Its Application to CMP Processes." *IEEE Transactions on Semiconductor Manufacturing*, vol. 14, No. 1, pp. 11-19.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Tan, K. K., H. F. Dou, and K. Z. Tang. May-Jun. 2001. "Precision Motion Control System for Ultra-Precision Semiconductor and Electronic Components Manufacturing (Abstract)." $51^{st}$ *Electronic Components and Technology Conference 2001*. Proceedings, pp. 1372-1379. Orlando, Florida.

Heuberger, U. Sep. 2001. "Coating Thickness Measurement with Dual-Function Eddy-Current & Magnetic Inductance Instrument (Abstract)." *Galvanotechnik*, vol. 92, No. 9, pp. 2354-2366+IV.

Wang, LiRen and Hefin Rowlands. 2001. "A Novel NN-Fuzzy-SPC Feedback Control System." $8^{th}$ *IEEE International Conference on Emerging Technologies and Factory Automation*, pp. 417-423.

Moyne, J., V. Solakhian, A. Yershov, M. Anderson, and D. Mockler-Hebert. Apr.-May 2002. "Development and Deployment of a Multi-Component Advanced Process Control System for an Epitaxy Tool (Abstract)." *2002 IEEE Advanced Semiconductor Manufacturing Conference and Workshop*, pp. 125-130.

Sarfaty, M., A. Shanmugasundram, A. Schwarm, J. Paik, Jimin Zhang, Rong Pan, M. J. Seamons, H. Li, R. Hung, and S. Parikh. Apr.-May 2002. "Advance Process Control Solutions for Semiconductor Manufacturing (Abstract)." $13^{th}$ *Annual IEEE/SEMI Advanced Semiconductor Manufacturing Conference. Advancing the Science and Technology of Semiconductor Manufacturing. ASMC 2002*, pp. 101-106. Boston, MA.

Campbell, W. J., S. K. Firth, A. J. Toprac, and T. F. Edgar. May 2002. "A Comparison of Run-to-Run Control Algorithms (Abstract)." *Proceedings of 2002 American Control Conference*, vol. 3, pp. 2150-2155.

Good, Richard and S. Joe Qin. May 2002. "Stability Analysis of Double EWMA Run-to-Run Control with Metrology Delay." *IEEE/CPMT International Electronics Manufacturing Technology Symposium*, pp. 355-363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214-222.

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285-287.

ACM Research, Inc. 2002. "Acm Ultra ECP® System: Electro-Copper Plating (ECP) Deposition." www.acmrc.com/ecp.html.

Applied Materials, Inc. 2002. "Applied Materials: Information for Everyone: Copper Electrochemical Plating." www.appliedmaterials.com/products/copper_electrochemical_plating.html.

KLA-Tencor Corporation. 2002. "KLA Tencor: Press Release: KLA-Tencor Introduces First Production-Worthy Copper CMP In-Situ Film Thickness and End-point Control System: Multi-Million Dollar Order Shipped to Major CMP Tool Manufacturer." www.kla-tencor.com/news_events/press_releases/press_releases2001/984086002.html.

Takahashi, Shingo, Kaori Tai, Hiizu Ohtorii, Naoki Kornai, Yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." *2002 Symposium on VLSI Technology Digest of Technical Papers*, pp. 32-33.

Cunningham, James A. 2003. "Using Electrochemistry to Improve Copper Interconnects." <http://www.e-insite.net/semiconductodindex.asp?layout=article&articleid=CA47465>.

Mar. 25, 2003. International Search Report for PCT/US02/24859 prepared by the European Patent Office.

Adams, Bret W., Bogdan Swedek, Rajeev Bajaj, Fritz Redeker, Manush Birang, and Gregory Amico. "Full-Wafer Endpoint Detection Improves Process Control in Copper CMP." *Semiconductor Fabtech*— $12^{th}$ Edition. Applied Materials, Inc., Santa Clara, CA.

Berman, Mike, Thomas Bibby, and Alan Smith. "Review of In Situ & In-line Detection for CMP Applications." *Semiconductor Fabtech*, $8^{th}$ Edition; pp. 267-274.

"Semiconductor Manufacturing: an Overview." <http://users.ece.gatech.edu/—gmay/overview.html>.

Levine, Martin D. 1985. *Vision in Man and Machine*. New York: McGraw-Hill, Inc. pp. ix-xii, 1-58.

Pilu, Maurizio. Sep. 2001. "Undoing Page Curl Distortion Using Applicable Surfaces." *IEEE International Conference on Image Processing*. Thessalonica, Greece.

May 23, 2003. Written Opinion for PCT/US01/24910.

Williams, Randy, Dadi Gudmundsson, Kevin Monahan, Raman Nurani, Meryl Stoller and J. George Shanthilnunar. Oct. 1999. "Optimized Sample Planning for Wafer Defect Inspection," *Semiconductor Manufacturing Conference Proceedings,1999 IEEE International Symposium on Santa Clara, CA*. Piscataway, NJ. pp. 43-46.

Jul. 23, 2003. Invitation to Pay Additional Fees and Communication Relating to the Results of the Partial International Search for PCT/US02/19116.

Aug. 1, 2003. Written Opinion for PCT/US01/27406.

Aug. 20, 2003. Written Opinion for PCT/US01/22833.

Miller, G. L., D. A. H. Robinson, and J. D. Wiley. Jul. 1976. "Contactless measurement of semiconductor conductivity by radio frequency-free-carrier power absorption." *Rev. Sci. Instrum.*, vol. 47, No. 7. pp. 799-805.

1999. "Contactless Bulk Resistivity/Sheet Resistance Measurement and Mapping Systems." www.Lehighton.com/fabtechl/index.html.

2000. "Microsense II Capacitance Gaging System." www.adetech.com.

El Chemali, Chadi et al. Jul./Aug. 2009. "Multizone uniformity control of a chemical mechanical polishing process utilizing a pre- and postmeasurement strategy." *J. Vac. Sci. Technol.* vol. 18, No. 4. pp. 1287-1296.

Mar. 5, 2001. "KLA-Tencor Introduces First Production-worthy Copper CMP In-situ Film Thickness and End-point Control System." http://www.kla-tenconcom/j/servlet/NewsItem?newsltemID=74.

2002. "Microsense II—5810: Non-Contact Capacitance Gaging Module." www.adetech.com.

Aug. 8, 2003. PCT International Search Report from PCT/US03/08513.

Oct. 14, 2003. PCT International Search Report from PCT/US02/21942.

Oct. 20, 2003. PCT International Search Report from PCT/US02/19116.

Oct. 23, 2003. PCT International Preliminary Examination Report from PCT/US01/24910.

"NanoMapper wafer nanotopography measurement by ADE Phase Shift." http://www.phase-shift.com/nanomap.shtml.

"Wafer flatness measurement of advanced wafers." http://www.phase-shift.com/wafer-flatness.shtml.

"ADE Technologies, Inc.—6360." http://www.adetech.com/6360.shtml.

"3D optical profilometer MicroXAM by ADE Phase Shift." http://www.phase-shift.com/microxam.shtml.

"NanoMapper FA factory automation wafer nanotopography measurement." http://www.phase-shift.com/nanomapperfa.shtml.

Rocha, Joao and Carlos Ramos. Sep. 12, 1994. "Task Planning for Flexible and Agile Manufacturing Systems." *Intelligent Robots and Systems '94. Advanced Robotic Systems and the Real World, IROS '94. Proceedings of the IEEE/RSJ/GI International Conference on Munich*, Germany Sep. 12-16, 1994. New York, New York: IEEE. pp. 105-112.

Mar. 15, 2002. Office Action for U.S. Appl. No. 09/469,227, filed Dec. 22, 1999.

Mar. 29, 2002. Office Action for U.S. Appl. No. 09/363,966, filed Jul. 29, 1999.

Jun. 20, 2002. Office Action for U.S. Appl. No. 09/619,044, filed Jul. 19, 2000.

Sep. 26, 2002. Office Action for U.S. Appl. No. 09/637,620, filed Aug. 11, 2000.

Oct. 23, 2002. Office Action for U.S. Appl. No. 09/469,227, filed Dec. 22, 1999.

Dec. 17, 2002. Office Action for U.S. Appl. No. 09/363,966, filed Jul. 29, 1999.

Feb. 10, 2003. Office Action for U.S. Appl. No. 09/619,044, filed Jul. 19, 2000.

Apr. 9, 2003. Office Action for U.S. Appl. No. 09/928,474, filed Aug. 14, 2001.

May 8, 2003. Office Action for U.S. Appl. No. 09/637,620, filed Aug. 11, 2000.

Jun. 18, 2003. Office Action for U.S. Appl. No. 09/655,542, filed Sep. 6, 2000.

Aug. 8, 2003. International Search Report for PCT/US03/08513.

Aug. 25, 2003. Office Action for U.S. Appl. No. 10/100,184, filed Mar. 19, 2002.

Sep. 15, 2003. Office Action for U.S. Appl. No. 09/928,474, filed Aug. 14, 2001.

Nov. 5, 2003. Office Action for US. Appl. No. 10/172,977, filed Jun. 18, 2002.

Dec. 1, 2003. Office Action for U.S. Appl. No. 10/173,108, filed Jun. 18, 2002.

Dec. 11, 2003. Office Action for U.S. Appl. No. 09/943,383, filed Aug. 342001.

Dec. 16, 2003. International Search Report for PCT/US03/23964.

Jan. 20, 2004. Office Action for U.S. Appl. No. 09/927,444, filed Aug. 13, 2001.

Jan. 23, 2004. International Search Report for PCT/US02/24860.

Feb. 2, 2004. Office Action for U.S. Appl. No. 09/363,966, filed Jul. 29, 1999.

Apr. 9, 2004. Written Opinion for PCT/US02/19116.

Sun, S.C. 1998. "CVD and PVD Transition Metal Nitrides as Diffusion Barriers for Cu Metallization." *IEEE*. pp. 243-246.

Tagarni, M., A. Furuya, T. Onodera, and Y. Hayashi. 1999. "Layered Ta-nitrides (LTN) Barrier Film by Power Swing Sputtering (PSS) Technique for MOCVD-Cu Damascene Interconnects." *IEEE*. pp. 635-638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I-PVD TA(N) Barrier in Dual Damascene" (Abstract). *Advanced Metallization Conference 2000*. San Diego, CA.

Eisenbraun, Eric, Oscar van der Straten, Yu Zhu, Katharine Dovidenko, and Alain Kaloyeros. 2001. "Atomic Layer Deposition (ALD) of Tantalum-Based Materials for Zero Thickness Copper Barrier Applications" (Abstract). *IEEE*. pp. 207-209.

Smith, S.R., K.E. Elers, T. Jacobs, V. Blaschke, and K. Pfeifer. 2001. "Physical and Electrical Characterization of ALD Tin Used as a Copper Diffusion Barrier, in 0.25 mum, Dual Damascene Backend Structures" (Abstract). *Advanced Metallization Conference 2001*. Montreal, Quebec.

Kim, Y.T. and H. Sim. 2002. "Characteristics of Pulse Plasma Enhanced Atomic Layer Deposition of Tungsten Nitride Diffusion Barrier for Copper Interconnect" (Abstract). *IEIC Technical Report*. vol. 102, No. 178, pp. 115-118.

Elers, Kai-Erik, Ville Saanila, Pekka J. Soininen, Wei-Min Li, Juhana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*. vol. 14, No. 13-14, pp. 149-153.

Peng, C.H., C.H. Hsieh, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603-606.

Van der Straten, O., Y. Zhu, E. Eisenbraun, and A. Kaloyeros. 2002. "Thermal and Electrical Barrier Performance Testing of Ultrathin Atomic Layer Deposition Tantalum-Based Materials for Nanoscale Copper Metallization." *IEEE*. pp. 188-190.

Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascene Interconnects with PECVD Silicon Carbide Barriers for 90/65-nm BEOL Technology." *IEEE*. pp. 595-598.

Jul. 25, 2003. International Search Report for PCT/US02/24858.

Mar. 30, 2004. Written Opinion for PCT/US02/19062.

Apr. 22, 2004. Office Action for U.S. Serial No. 09/998,372, filed Nov. 30, 2001.

Apr. 28, 2004. Written Opinion for PCT/US02/19117.

Apr. 29, 2004. Written Opinion for PCT/US02/19061.

May 5, 2004. Office Action for U.S. Appl. No. 09/943,955, filed Aug. 31, 2001.

May 5, 2004. International Preliminary Examination Report for PCT/US01/27406.

May 28, 2004. Office Action for U.S. Appl. No. 09/943,383, filed Aug. 31, 2001.

Jun. 3, 2004. Office Action for U.S. Appl. No. 09/928,474, filed Aug. 14, 2001.

Jun. 23, 2004. Office Action for U.S. Appl. No. 10/686,589, filed Oct. 17, 2003.

Jun. 30, 2004. Office Action for U.S. Appl. No. 09/800,980, filed Mar. 8, 2001.

Jul. 12, 2004. Office Action for U.S. Appl. No. 10/173,108, filed Jun. 8, 2002.

Aug. 18, 2004. International Preliminary Examination Report for PCT Serial No. PCT/US02/19116.

IslamRaja, M. M. C. Chang, J. P. McVittie, M. A. Cappelli, and K. C: Saraswat. May/Jun. 1993. "Two Precursor Model for Low-Pressure Chemical Vapor Deposition of Silicon Dioxide from Tetraethylorthosilicate." *J. Vac. Sci. Technol. B*, vol. 11, No. 3, pp. 720-726.

Kim, Eui Jung and William N. Gill. Jul. 1994. "Analytical Model for Chemical Vapor Depositiorf of $SiO_2$ Films Using Tetraethoxysliane and Ozone" (Abstract). *Journal of Crystal Growth*, vol. 140, Issues 3-4, pp. 315-326.

Guo, R.S, A. Chen, C.L. Tseng, I.K. Fong, A. Yang, C.L. Lee, C.H. Wu, S. Lin, S.J. Huang, Y.C. Lee, S.G. Chang, and M.Y. Lee. Jun. 16-17, 1998. "A Real-Time Equipment Monitoring and Fault Detection System." *Semiconductor Manufacturing Technology Workshop*, pp. 111-121.

Lantz, Mikkel. 1999. "Equipment and APC Integration at AMD with Workstream." *IEEE*, pp. 325-327.

Jul. 15, 2004. Office Action for U.S. Appl. No. 10/172,977, filed Jun. 18, 2002.

Aug. 2, 2004. Office Action for U.S. Appl. No. 10/174,377, filed Jun. 18, 2002.

Aug. 9, 2004. Written Opinion for PCT Serial No. PCT/US02/19063.

Aug. 24, 2004. Office Action for U.S. Appl. No. 10/135,405, filed May 1, 2002.

Aug. 25, 2004. Office Action for U.S. Appl. No. 09/998,384, filed Nov. 30, 2001.

Sep. 9, 2004. Written Opinion for PCT Serial No. PCT/US02/21942.

Sep. 16, 2004. International Preliminary Examination Report for PCT Serial No. PCT/US02/24859.

Sep. 15, 2004. Office Action for U.S. Appl. No. 10/632,107, filed Aug. 1, 2003.
Sep. 29, 2004. Office Action for U.S. Appl. No. 09/363,966, filed Jul. 29, 1999.
Oct. 1, 2004. International Preliminary Examination Report for PCT Serial No. PCT/US03/23964.
Oct. 6, 2004. Office Action for U.S. Appl. No. 10/759,108, filed Jan. 20, 2004.
Oct. 12, 2004. International Preliminary Examination Report for PCT Serial No. PCT/US02/19061.
Nov. 17, 2004. Written Opinion for PCT Serial No. PCT/US01/27407.
Boning, Duane et al. "Run by Run Control of Chemical-Mechanical Polishing." *IEEE Trans*. Oct. 1996. vol. 19, No. 4. pp. 307-314.
Moyne, James et al. "A Run-to-Run Control Framework for VLSI Manufacturing." *Microelectronic Processing '93 Conference Proceedings*Sep. 1993.
Telfeyan, Roland et al. "Demonstration of a Process-Independent Run-to-Run Controller." *187th Meeting of the Electrochemical Society*. May 1995.
Moyne, James et al. "A Process-Independent Run-to-Run Controller and Its Application to Chemical-Mechanical Planarization." *SEMI/IEEE Adv. Semiconductor Manufacturing Conference*. Aug. 15, 1995.
Moyne, James et al. "Adaptive Extensions to be a Multi-Branch Run-to-Run Controller for Plasma Etching." *Journal of Vacuum Science and Technology*. 1995.
Sachs, Emanuel et al. "Process Control System for VLSI Fabrication.".
Chaudhry, Nauman et al. "Active Controller: Utilizing Active Databases for Implementing Multi-Step Control of Semiconductor Manufacturing." *University of Michigan*. pp. 1-24.
Chaudhry, Nauman et al. "Designing Databases with Fuzzy Data and Rules for Application to Discrete Control." *University of Michigan*. pp. 1-21.
Chaudhry, Nauman et al. "A Design Methodology for Databases with Uncertain Data." *University of Michigan*. pp. 1-14.
Khan, Kareemullah et al. "Run-to-Run Control of ITO Deposition Process." *University of Michigan*. pp. 1-6.
Moyne, James et al. "Yield Improvement @ Contact Through Run-to-Run Control.".
Kim, Jiyoun et al. "Gradient and Radial Uniformity Control of a CMP Process Utilizing a Pre- and Post-Measurement Strategy." *University of Michigan*.
Boning, Duane et al., "Statistical Methods for Semiconductor Manufacturing," Encyclopedia of Electronic Engineering, J.G. Webster, Ed., Feb. 1999, pp. 1-22.
Dishon, G. M., et al., "Dielectric CMP Advanced Process Control Based on Integrated Monitoring." Ltd. Rehoveth, Israel: Nova Measuring Instruments, 11 pages. Feb. 1998.
IBM Technical Disclosure Bulletin, Feb. 1984. "Method and Apparatus of in Situ Measurement and Overlay Error Analysis for Correcting Step and Repeat Lithographic Cameras." IBM Technical Disclosure Bulletin, pp. 4855-4859.

Islamraja, M. M., et al., "Two precursor model for low-pressure chemical vapor deposition of silicon dioxide from tetraethylorthosilicate," J. Vac. Sci. Technol. B 11(3), May/Jun. 1993, pp. 720-726.
Kim, Eui Jung, et al., "Analytical Model Chemical Vapor Deposition of SiO2 films using tetraethoxysilane and ozone," Journal of Crystal Growth, vol. 140, Issues 3-4, Jul. 1994, pp. 315-326, (abstract only).
Levine, Martin D., "Vision in Man and Machine," New York: McGraw-Hill, Inc., 1985, pp. ix-xii, 1-58, 1985.
PCT International Search Report for PCT/US02/21942, Oct. 14, 2003.
Pilu, Maurizio, Undoing p. Curl Distortion Using Appliance Surfaces, IEEE International Conference on Image Processing, Sep. 2001, Thessalonica Greece, pp. 237-240.
Rauf. S.; Kushner, M.J.,Semiconductor Manufacturing, IEEE, "Virtual plasma equipment model: a tool for investigating feedback control in plasma processing equipment," Transactions on vol. 11, Issue 3, Date: Aug. 1998, pp. 486-494.
Rauf, Shahid and Mark J. Kushner. "Controller design issues in the feedback control of radio frequency plasma processing reactors." American Vacuum Society, pp. 704-712, Jun. 1999.
Spanos, Costas, J., "A Multistep Supervisory Controller for Photolithographic Operations (Abstract)," Proceeding of the Symposium on Process Control, Diagnostics, and Modeling in Semiconductor Manufacturing, pp. 3-17, May 1995.
Yeh, C., et al., "Implementation Challenges of a Feedback Control System for Wafer Fabrication," IEEE Internation Semiconductor Manufacturing Technology Symposium, pp. 438-442, 1993.
Office Action for U.S. Appl. No. 12/006,328, mailed Sep. 10, 2009.
Office Action for Appl. No. 12/006,328, mailed Sep. 10, 2009.
Applied Materials Software Office Action for U.S. Appl. No. 09/943,955 (P019) mailed May 5, 2004.
Applied Materials Software Office Action for U.S. Appl. No. 09/943,955 (P019) mailed Dec. 30, 2004.
Applied Materials Software Office Action for U.S. Appl. No. 09/943,955 (P019) mailed Jul. 26, 2005.
Applied Materials Software Office Action for U.S. Appl. No. 09/943,955 (P019) mailed Jan. 31, 2006.
Applied Materials Software Notice of Allowance for U.S. Appl. No. 09/943,955 (P019) mailed Sep. 11, 2006.
Applied Materials Software Office Action for U.S. Appl. No. 11/645,989 (P019D) mailed Nov. 14, 2008.
Applied Materials Software Office Action for U.S. Appl. No. 11/645,989 (P019D) mailed Jun. 09, 2009.
Office Action for U.S. Appl. No. 10/174,377, mailed Aug. 2, 2004.
Office Action for U.S. Appl. No. 10/174,377, mailed Feb. 25, 2005.
Office Action for U.S. Appl. No. 10/174,377, mailed Sep. 7, 2005.
Office Action for U.S. Appl. No. 10/174,377, mailed May 31, 2006.
Office Action for U.S. Appl. No. 11/701,401, mailed Feb. 5, 2009.
Office Action for U.S. Appl. No. 11/701,401, mailed Aug. 7, 2009.

\* cited by examiner

DYNAMIC METROLOGY SCHEMES AND SAMPLING SCHEMES FOR ADVANCED PROCESS CONTROL IN SEMICONDUCTOR PROCESSING

CROSS-REFERENCES TO RELATED APPLICATIONS

This application claims the benefit of U.S. Provisional Application Ser. No. 60/322,459, filed Sep. 17, 2001, which is expressly incorporated herein by reference; and U.S. Provisional Application Ser. No. 60/298,878, filed Jun. 19, 2001, which is expressly incorporated herein by reference.

BACKGROUND OF THE INVENTION

1. Field of the Invention

The present invention concerns computer-related and/or assisted methods, systems and computer readable mediums for metrology during process control. More specifically, it relates to dynamic adjustment of metrology schemes and sampling during advanced process control methods, for example during control of semiconductor technology manufacture.

2. Related Art

In the wafer fabrication art, measurements are made by metrology tools on wafers as they are being manufactured by processing devices, in order to ensure that the wafers are produced according to a predefined specification. The measurements are made of physical properties such as film thickness and uniformity, dopant concentration, gate length and critical dimension. This is known as the science of "metrology."

Measurements to be made are typically specified in a "die map". The die map indicates where the different chips (or die) are located on a wafer (in the typical situation where multiple chips are formed on and eventually cut from a single wafer), as well as significant locations, such as corners, on each die. In order to measure the right hand corner on each die, for example, multiple points are measured on the wafer in accordance with the die map. Ordinarily a die map is a digital representation of coordinate points, or "metrology coordinates," on the wafer.

The metrology coordinates are usually provided by an engineer, and vary depending on the engineer's preferences. Metrology coordinates are conventionally provided as x, y coordinates.

A "sampling plan," alternatively referred to as a "metrology plan," contains metrology coordinates drawn from the die map. The sampling plan denotes a specific plan for taking certain measurements. These measurements may include some or all of the possible points and/or chips in the die map.

A conventional metrology system assigns a sampling plan that predetermines which wafers are to be measured in connection with a processing device, and the measurements which are to be taken of those wafers by the metrology tool. For example, the sampling plan might define that each fifth wafer should be measured at pre-designated locations. These sampling plans are not changed after being initially assigned, and hence the metrology systems are static.

Unfortunately, manufacturing results tend to drift away from the intended target or specification when there is a change in the manufacturing process, such as a change in recipe, preventative maintenance, consumables change, environmental change or a new lot of wafers. Conventional metrology systems tend to miss some wafers which are outside specification limits, since these systems use a virtually consistent measurement scheme, having consistently frequent measurements with consistent spatial resolution, without taking into consideration whether any changes were introduced into the manufacturing process which might change the manufacturing results.

Manufacturing systems do not typically call for a measurement of every wafer, since measuring takes time and increasing the number of measurements results in a decrease of productivity. On the other hand, measuring fewer wafers tends to lead to delayed detection of critical information for process control that may significantly impact wafer yield. While conventional sampling systems will sample wafers during and/or after production, these systems do not adjust the initially assigned sampling plan for the wafers during production.

Thus, there remains a need for dynamic metrology to improve the quality of products. For semiconductor wafers, there remains a need to better check whether each specification is met under production conditions. There also remains a need to respond to a change in parameters which may cause a variance from intended target results, such as recipe parameters, and to adjust the frequency and/or spatial resolution of measurements. Unfortunately, taking measurements takes time, and most processing devices are faster than the measurements that need to be taken by metrology tools in order to characterize the wafers using a metrology. Thus, there remains a need for a method, system and medium to react to changes potentially affecting the system results, and to appropriately adjust, increase, or decrease the measurements accordingly.

SUMMARY OF THE INVENTION

The present invention alleviates the problems of the conventional techniques described above by dynamically determining whether a wafer needs to be measured for process control based on changes in the resources, recipes, etc. In addition, for a given wafer to be measured, measuring points are also dynamically assigned to the metrology tool.

More specifically, two variations of embodiments of the present invention are contemplated and may be used independently or together. According to the first variation, the frequency at which wafers are measured ("wafer-to-wafer") is adjusted, following an event that suggests that more (or fewer) wafers should be measured. According to the second variation, the spatial resolution of the measurements of those wafers selected for measurement ("within-wafer") is increased or decreased, following an event that suggests each wafer which is measured should be measured in greater (or lesser) detail.

In one or more embodiments of the present invention, candidate coordinate measurement points are mapped in a die map, and a subset of the candidate coordinate measurement points are selected as the initial points where measurements are to be made. Subsequently, according to the within-wafer variation, the invention dynamically selects more, fewer or different points (depending on the circumstances) to be measured from among the candidate coordinate measurement points. According to the wafer-to-wafer variation, when there is a change in the manufacturing process, the number of measurements may be increased, to measure every wafer rather than just every third wafer for example. As one example, when a new recipe is implemented to significantly change the thickness at a particular region on the wafer, a greater number of within-wafer measurements can be made at that location by selecting more and/or different candidate measurement points. As another example, when a fault is detected, the frequency of wafers selected for measurement is increased; this increases the probability of detecting defectively manufactured wafers and correcting the control parameters (such as in connection with a feed forward/feedback method). In some situations, large deviations may require less frequent measurement or less spatial resolution than small deviations when the large deviations clearly identify the problem, whereas small deviations may be difficult to identify and more frequent and/or dense measurements may be necessary. The reverse may be appropriate in other situations regarding the frequency and density of measurements, or it may be the case that the same number of measurements may be taken regardless of deviation.

According to one or more embodiments of the present invention, there is provided a method, system and/or computer-implemented method for measuring at least one manufacturing characteristic for at least one product manufactured by a manufacturing process. Information is provided, representative of a set of candidate points to be measured by the manufacturing process on the at least one product. The manufacturing process executes a plan for performing measurements on the at least one product to measure the at least one manufacturing characteristic, the plan defining the measurements to be made responsive to the set of candidate points. A change in the manufacturing process is detected, the change including at least one of: receiving new material in the manufacturing process, detecting a fault in the manufacturing process, detecting a change in a control parameter in the manufacturing process, and detecting a variation in a measurement of the at least one product.

According to one or more embodiments, the plan for performing measurements is adjusted based on the detected change and at least one additional measurement is performed responsive thereto.

According to one or more embodiments, the measurements of the plan are adjusted wafer-to-wafer and/or within-wafer.

According to one or more embodiments, the product is a semi-conductor wafer and the manufacturing process is an automated semi-conductor manufacturing process.

According to one or more embodiments, the plan further includes information representative of a metrology recipe.

According to one or more embodiments, the candidate points are included in a map corresponding to the at least one product. The plan may be a pre-determined sampling plan.

According to one or more embodiments, the plan defines at least one region on the product, each of the candidate points corresponding to the at least one region.

According to one or more embodiments, the adjustment includes determining the at least one region corresponding to the detected change, selecting the at least one additional measurement responsive to the candidate points corresponding to the determined region, assigning the selected at least one additional measurement to be performed under the plan, and revising at least one of the measurements, the additional measurement and the plan. The adjustment may include determining whether the detected change may affect a series of products, and if so, determining whether to measure at least one of the products in the series of products. The products may be provided in a group, and the plan may further include first information representative of the products in the group that are available to be measured, and second information representative of the products in the group that are to be measured under the plan.

According to one or more embodiments, information representative of measurement results on the product is discarded when the measurements results indicate a variation in measurement of the product and/or when a fault is detected in the manufacturing process.

According to one or more embodiments, the sampling plan includes a plurality of splines radiating from a center of a product, and the candidate points are distributed along the splines. The distribution of the candidate points along the splines may be weighted according to a surface area of the product. According to one or more other embodiments, the sampling plan includes a plurality of radially distributed candidate points.

BRIEF DESCRIPTION OF THE FIGURES

The above mentioned and other advantages and features of the present invention will become more readily apparent from the following detailed description in the accompanying drawings, in which.

DETAILED DESCRIPTION

Figure 1:
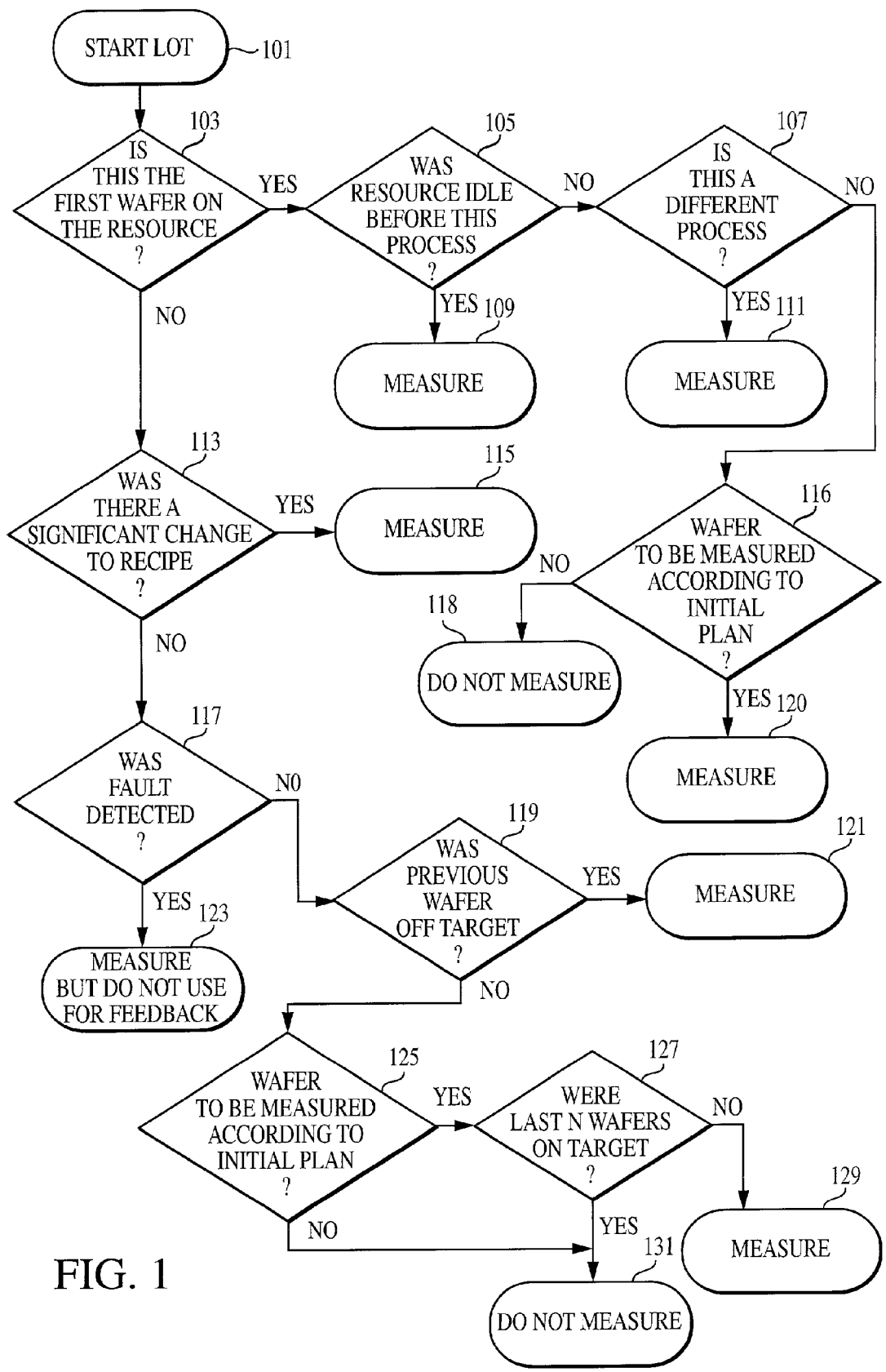
FIG. 1 is a flow chart showing one example of dynamic metrology for "wafer-to-wafer" processing in the present invention.

The following detailed description includes many specific details. The inclusion of such details is for the purpose of illustration only and should not be understood to limit the invention. Throughout this discussion, similar elements are referred to by similar numbers in the various figures for ease of reference. In addition, features in one embodiment may be combined with features in other embodiments of the invention.

In one or more embodiments of the present invention, static metrology means there is a pre-determined sampling plan in connection with a wafer (or other device) to be measured, specifying substantially the same points for each wafer (or the other device). In contrast, a dynamic metrology plan utilizes an initial sampling plan and adjusts the sampling responsive to certain events or non-events. As an example of an adjustment due to a non-event, if the last ten wafers measured are all the same, and if the processing device did not change, and if the recipe on the processing device did not change, one could reasonably assume that the next series of wafers will have measurements that are also all the same. That being the case, then in order to increase throughput and decrease the time it takes to do measurements, the invention provides for dynamically adjusting the measurements, for example, such that every third wafer instead of every wafer is measured. This invention thus detects and adjusts for not only potential errors, which could arise for example upon a recipe change, but also for accuracy.

One or more embodiments of the present invention contemplate that the invention may be used in connection with wafer-to-wafer measurements described above, as well as, or alternatively, in connection with within-wafer measurements. Consider an example of within-wafer measurements, in which measurements are taken along a radius of a 200 mm diameter wafer and the radius is measured in 10 mm increments. During processing it is noted or detected by the usual detection process that there is a large variation at the 50 mm and 60 mm points. For the next sample, the system adjusts to measure another point from the sampling plan between 50 mm and 60 mm to better characterize that variation, or optionally to measure an additional point, for example, between 40 mm and 50 mm that is near the location of the variation. If the die map includes points at 45 mm and 55 mm, these points can then be added as measurement points. Adjusted measurements now encompass in this example, 40 mm, 45 mm, 50 mm, 55 mm, and 60 mm. The system dynamically added the two additional points (in the example) to better characterize the measurement and/or the variation. Where there are provided a number of candidate points in the die map allowing points to be added or substituted, the system can select among the points any of several ways, such as selecting the closest to mean, mode, other statistical analysis, etc.

A sampling plan provides specific measure points within a die, a die being the section on the wafer that will typically eventually become a single chip after processing. There are specified points within the die that are candidates for measuring. The map of the die is stored, preferably in an electronic format representing the map. One appropriate place for storing the die map information is in the factory automation system ("MES" or manufacturing execution system). The stored die map information may be advantageously retrieved and translated to determine the available points for measurement on the wafer. Referring back to the previous example proposing measurement points on the radius at 45 mm and 55 mm, if these specific points are not relevant to the current die (e.g., they are not specified by the die map), an appropriate replacement would be points selected from the candidate points specified by the die map which are close to or between 45 mm and 55 mm. Those points could be selected dynamically as well. Other criteria may be used for selecting points as well.

Dynamic metrology is performed to better meet a certain specification. For example, if recipe parameters are changed on the processing device, to adjust the thickness of a film that is deposited on the wafer, it may be desirable to more closely check whether the specification is still being achieved by performing measurements.

In order to avoid slowing down the process, one or more embodiments of the present invention advantageously determine the appropriateness of performing additional measurements when one or more events occur that are likely to indicate an internal or external change affecting the manufacturing process or results. The increase in measurements and possible corresponding decrease in processing occur on an as-needed basis and/or based on predetermined criteria.

The wafer-to-wafer variation of the invention, for example, can check for events which may affect a series of wafers and may adjust the sampling plan. For example, during processing, the system determines if an increase is needed in the frequency of wafers measured for process control, for example, based on 1) a change in the processing device the wafers are processed on, 2) a change in the parameters or recipe that were used by the processing device to process the wafer, 3) large detected variations or errors in measurements, and/or 4) a significant run of wafers without errors.

Particularly regarding within-wafer variation, one or more embodiments of the present invention contemplate that the system obtains a stored die map with metrology coordinate information from the MES. As indicated, the system can provide not only for assigning the measurement points optionally dynamically, but also for de-assigning.

One or more embodiments of the present invention envision changing the sampling plan using information that is gathered from the MES and automatically using that new sampling plan, depending on, for example the type of processing device on which the wafers are processed. Advantageously, the system has stored information about a wafer that indicates, among other things, the type of chip or type of device and an associated sampling plan to be used when measuring a wafer containing a specific device. Based on the type of device, the associated sampling plan or die map can be obtained, where the die map includes a set of candidate metrology points. The system then selects metrology points for the current wafer from the set of, or responsive to, the candidate points in the die map.

With respect to the sampling plan, generation of the sampling plan can vary from device to device (chip type to chip type) and some measurements may be based on die distribution on the wafer. By dividing a wafer into regions and using regions of the wafer for measurement, one or more embodiments of the present invention provide flexibility in selecting one or more points from available points in the region. Use of regions is one way to provide a pool of candidate points, from which the system may select points that are most relevant to the desired information about the film on the wafer.

In practice, the system may, for example, measure twenty-two to twenty-five points per wafer from the pool of candidate points. For some processes the system might measure fewer points, such as eight points, because it takes longer to measure those points or the wafer processing time is faster. For other processes the system might measure one point of another type of property, such dopant concentration, which is a relatively slow measurement.

In any event, it is important to balance the time consumed in a measurement against the need to produce quality products. Manufacturers consider it to be more important to be within specifications and not produce defective product, than to rapidly produce product of suspect qualities.

Each processing device on which a wafer is processed has a different processing time, and therefore the selected standard sampling rate may depend on the speed of processing of the processing device and metrology tool. On some processing devices, measurements on every wafer will not slow down processing since the speed of the processing device is slower than the measurements by the metrology tool. For example, polishing and cleaning processing devices may consume five minutes or more to process a wafer. In that case a post-processing measurement by the metrology tool on every wafer would often not reduce throughput.

Additionally, the system may determine whether or not to make additional measurements based on the initial and the final condition of the wafers. For example, if there is a situation in which the incoming thickness profile of a cross section of a wafer does not change very much, the system may reduce the frequency of samples of incoming profiles, wafer-to-wafer. On the other hand, if the incoming profile is changing significantly, it may be desirable to measure every entering wafer.

Reference is made to FIG. 1, illustrating an example of a flow chart for one or more embodiments of a wafer-to-wafer dynamic metrology system. The system checks whether there may have been a significant change in the state of the processing device, which can be detected by checking, for example, idle time, change of consumables, etc. There may be other events that could be checked that would indicate a potential change in the processing device or lead one to believe that it might have been changed. It is possible that the processing device itself may include sufficient programming to recognize or track those type of events. The flowchart example in FIG. 1 includes an example set of events or state changes that initiate analysis and decision making, based upon information gathered from the processing device and based on a significant internal or external change (e.g., system was idle for a long time, chamber was cleaned, new batch of slurry, initial wafer, etc.). Other events or states may be included in the set from which it is determined whether or not to measure a wafer.

One or more embodiments, of the present invention also envision the following. Assume that there is provided an initial sampling plan. The plan could, for example, direct measuring of specific points on each wafer and/or comprise information indicating which wafers within the lot will be measured. The wafer is measured according to the sampling plan. According to the wafer-to-wafer metrology plan, the system deviates from the initial sampling plan when warranted. The system could return to the initial sampling plan once it detects that the process is again "normal" or again producing product within specification.

Referring still to FIG. 1, consider for example a typical cassette of twenty-five wafers to be processed according to one or more embodiments of the present invention. The cassette of wafers arrives at the processing device, usually from some other processing device, and processing on the lot is started, at block 101.

If a wafer being processed by a processing device is the first wafer of a particular lot on the processing device then it may be desirable to measure this wafer, in order to detect if perhaps there was some processing device related property that changed. Thus, at block 103, the system checks whether it is processing the first wafer on the resource. This could also include situations such as following preventative maintenance where the chamber in the processing device has been cleaned or perhaps a consumable was replaced in the processing device.

If a processed wafer was the first (or other predetermined) wafer on the resource in accordance with block 103, then the system checks at block 105 whether the processing device was idle, greater than some specified time before starting the present process; and if the processing device was not significantly idle, the system checks at block 107 whether the process was changed or altered. If the process was not changed, a measurement of the wafer may or may not be implemented according to the initial sampling plan at block 116; the wafer is accordingly measured at block 120 or not measured at block 118. On the other hand, if the resource was idle for a sufficiently long time, or if the process has changed, at blocks 109 or 111 respectively, a new measurement is taken.

If the wafer was not the first one on the processing device, then as indicated, at block 113, the system checks whether a significant change was made to the recipe, such as by the process control algorithm or process controller. It is typically desirable to ensure that even if a significant change was made, the specifications are still satisfied. A change to the recipe could include time, pressures, flow rates, etc., or even a completely different recipe. If the recipe was significantly changed, then at block 115, the system calls for a measurement of the wafer.

The system also checks whether a fault was detected, such as in the processing device. Processing devices may be monitored by the factory automation system, for example to determine whether there is some problem with the processing device, either from the automation system side or from the processing device itself. Also, the processing device itself may include the ability to detect a fault. If a fault is detected, the system could subsequently measure to confirm that the wafer is within specifications. Thus, at block 117, it is determined whether a fault was detected. If a fault was detected, at block 123 the system measures the wafer. Since it is likely that the wafer has errors, it might be desirable not to use such measurements for feedback purposes.

There may be two cases for uses of measurement values. In the first case, the system uses the measurement value or stores that measurement value for further processing, such as measurements following a resource idle condition. In the second case, such as following a fault detection, the system may check the wafer or series of wafers for acceptability but does not store the value which might skew historical results. In the first case, the system is using the historical value for modeling of the processing device in order to better predict how the processing device will behave, or for other purposes. For example, where a fault is know to have occurred, the manufacturer will want to find and correct the cause of the fault, often by changing a process component or parameter. Thus, the process data attributed to a wafer that triggered detection of a fault is not indicative of the "normal" processing in the process system. On the other hand, for the fault detection case, the system merely ensures that that wafer is a good (e.g., usable) wafer versus a bad wafer. Unfortunately, usually following a fault there are several wafers in a series potentially affected by the fault, and it is desirable to measure the wafers in the series. Once the wafer(s) are measured following a fault, if the wafer(s) are bad, it is desirable to mark the wafer as questionable and discard the measurement value as well as perhaps the wafer itself.

Similarly, if a wafer is off target despite no change to the recipe, no detection of a fault, and no other likely cause of error, there is likely to be a series of off-target wafers. Consequently, where a wafer with errors is detected, the next wafer is significantly more likely to also experience errors. Thus, at block 119, the system checks whether the previous wafer was sufficiently far from the target, as determined by a previous measurement made in accordance with FIG. 1. If so, then at block 121 the system measures the current wafer as well.

Finally, it may be desirable to measure the wafer according to the initial sampling plan. Thus, at block 125, the system checks the initial sampling plan to advantageously determine whether the current wafer should be measured according to the initial sampling plan. If not, then the system does not measure the wafer. According to one or more embodiments, a modified sampling plan is used to measure the wafer under appropriate situations, such as after a change of type of chip.

Similarly, if no conditions affecting wafer processing are changed, and if the series of wafers have been on target, one would expect the wafers to continue to be on target. Thus, as indicated at block 127, if the measurement of the last n wafers were sufficiently on target, there is no need to measure the wafer in this instance or as frequently. In this manner, the number of measurements can be reduced and processing time is potentially reduced. On the other hand, if at block 127 the system determines that the last series of n wafers were not on target, at block 129 the system measures the current wafer.

Reference is made to FIG. 2, a map of a wafer illustrating measurement regions for the within-wafer dynamic metrology. It is referred to as "within-wafer" since the system may be changing the metrology within the wafer, in distinction to the previously-described wafer-to-wafer dynamic metrology. (FIG. 3, described in detail below, illustrates an example of a flow chart for within-wafer dynamic metrology.)

Where the process performed by the processing device on the wafer is symmetric such that the system is affecting portions of the film on the wafer in a symmetric matter, it may be reasonable to measure fewer points, perhaps a measurement of only one radii. On the other hand, where there were previous steps performed by the processing device on the wafer that were asymmetric, information on additional measurement values may need to be captured. The number of desirable measurement points therefore additionally depends upon the type of process, and upon the step in the process if applicable.

For instance, given a very uniform process, perhaps only five points on the wafer need to be measured to provide sufficient precision. On the other hand, given a very non-uniform process or much unresolved information, perhaps twenty-five points should be measured to achieve a sufficient level of precision.

Typically the factory automation system, or the software in the factory automation system, is programmed to determine which process (or processes) or step within a process is being run on which processing device. Based on that information, the system can determine whether few or many points are desired for an adequately precise measurement or set of measurements of the wafer.

Consider, for example, a processing device with multiple chambers or resources independently processing wafers. In this example, the process control algorithm describes four recipe changes. The invention determines which wafers need to be measured (wafer-to-wafer), and any desired change in number of measurement points due to the dynamic recipe change (within-wafer). This metrology strategy consequently enables a dynamic metrology change based on the die map from the MES or other factory automation system.

The die map provides a pool of candidate points corresponding to a wafer to be measured, and the system can select from among the candidate points, the points that correspond most directly to the information needed or desired in connection with that wafer. The MES or other factory automation system provides information indicating allowable or relevant possible points that could be measured; from those candidate points, one or more embodiments of the present invention contemplate that the system selects the minimal set of points that would capture the desired information.

Figure 2A:
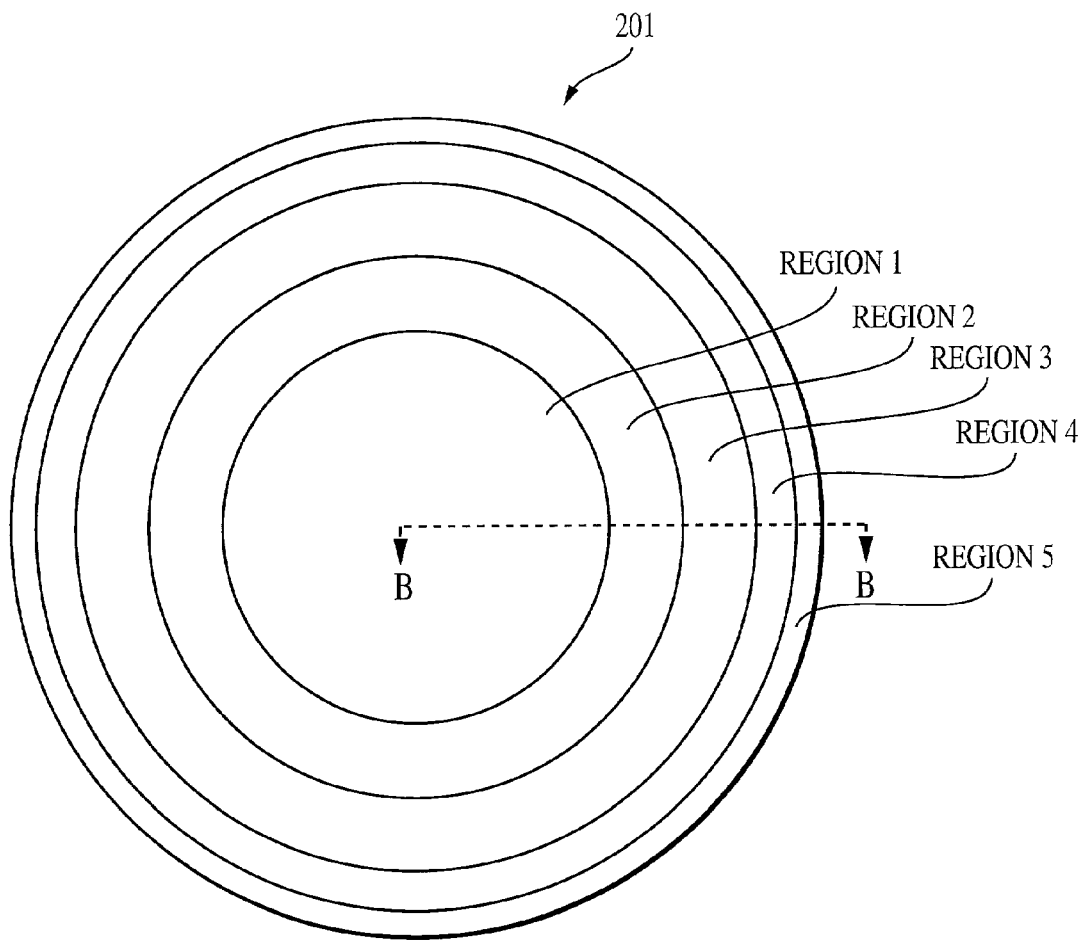
FIGS. 2A and 2B are an illustration of regions on a wafer, with FIG. 2A being a plan view of the wafer and FIG. 2B being a cross-section of the wafer along radius B-B of FIG. 2A.
Figure 2B:
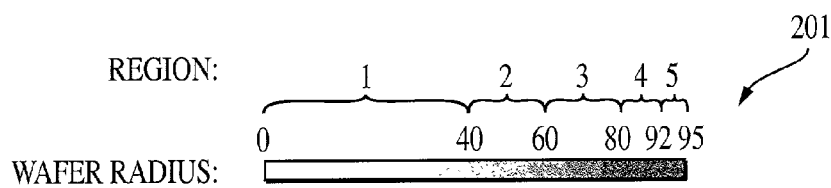

FIGS. 2A and 2B illustrate a plan view and a cross section of an example of a typical wafer 201, in this instance having radial regions 1 through 5. As shown in FIG. 2A, the illustrated wafer 201 is circular. Chips on the wafer are usually square and placed across the wafer. At the end of processing, the chips are divided from the wafer. FIG. 2B shows a cross section of the wafer of FIG. 2A, across section B-B from one edge to the center of the wafer. Region 1 extends radially from the center to 40 mm; region 2 extends from 40 mm to 60 mm; region 3 extends from 60 mm to 80 mm; region 4 extends from 80 mm to 92 mm; and region 5 extends from 92 mm to 95 mm. A wafer could be divided into more or fewer regions. Also, although the regions are illustrated as radial, the same concepts apply where the regions are neither circular nor radial.

A die map includes a sampling plan that optionally distinguishes among different regions of the wafer. Such a sampling plan would include information indicating a set of measurement points, associated with regions of the wafer.

Figure 3:
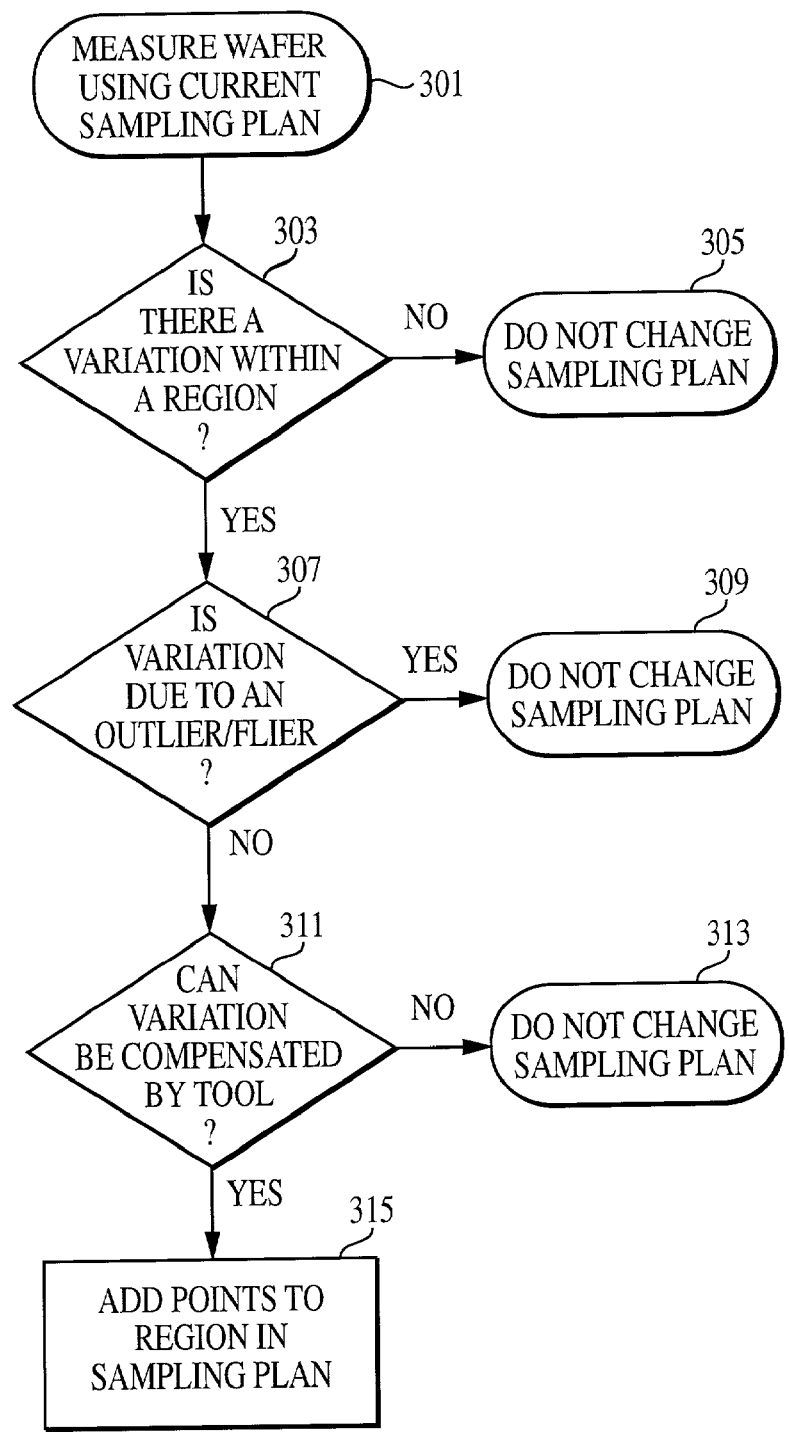
FIG. 3 is a flow chart showing one example of dynamic metrology for "within-wafer" processing in accordance with one or more embodiments of the present invention.

The flowchart of FIG. 3 discusses an example of within-wafer metrology, that is, when the system should or should not change the measurement points. FIG. 3 thus contrasts to FIG. 1, indicating whether to measure a current wafers (wafer-to-wafer dynamic metrology). FIG. 3 defines an example set of questions to determine whether more points are needed to measure a region variation within a given wafer.

Reference is now made to FIG. 3, illustrating an example of the within-wafer dynamic metrology, as contemplated by one or more embodiments of the present invention. At block 301, the wafer is measured by the metrology tool utilizing the current sampling plan. Having measured the wafer, the system analyzes the current wafer to determine whether there are significant variations that might warrant changing the sampling plan for the next wafer. The wafers are potentially changed from run to run. That is, the system performs an action, and then based upon the results of that action, the system determines whether to utilize the same sampling plan for the next wafer or to do something different.

At block 303, it is determined whether there is a variation from the specification within one or more of the regions on the current wafer. If not, then as indicated by block 305 there is no need to add more sampling points.

At block 307, if there was a variation in a region, it is then determined whether the variation was due to an outlier or flier. An outlier or flier is a situation in which the measurement point is not an accurate reflection of the actual value. If there is a speck of dust on the wafer, for example, this may cause an erroneous thickness measurement; or for instance the actual measured point may be significantly distant from the correct measurement coordinates, resulting in significantly higher or lower thickness. An outlier or flier can be determined statistically in a number of ways based on how different the measured point is from the expected measurement. It may be difficult to determine in some cases whether the variation is due to a flier or if there is an actual variation. The data collected could be used to indicate a potentially defective die.

Of course, it should be understood that one or more embodiments of the present invention contemplate that any number of other causes for variations can be detected, and a decision made accordingly as to whether (and how) the sampling plan may be changed.

Referring still to FIG. 3, if the variation from the specification is due to an outlier or flier, then as indicated by block 309, the sampling plan is not changed. The measurement is not likely to be an accurate reflection of the wafer, and therefore the system should not react to the measurement.

At block 311, it is determined whether the variation from the specification is one for which the processing device can possibly compensate. For example, a processing device may be able to correct for radial variation, but not for a variation that is angular or azimuthal. Thus, at block 313, if the processing device cannot compensate for the variation in the region, then the sampling plan is not changed. On the other hand, if the processing device can compensate for the variation in the region, then at block 315 points are added to the region in the sampling plan for the next wafer in order to better characterize the region. Optionally, the data may be fed back to system controller in order to change the process in response to this drift condition.

According to one or more embodiments of the inventions, an error in one or more wafers may initiate some level of error handling and/or alarming. If there is an error that does not result in a change to the sampling plan, such as a non-systematic variation, and even if the system cannot compensate, in one or more embodiments of the present invention the system might generate an alarm or trigger performance of other error handling. If the error exhibits the characteristics of a systematic effect, such as wafers out of specification, then an alarm could be generated. If the error is one wafer that is out of specification, according to one or more embodiments of the invention, the system flags that wafer.

The flow chart of FIG. 3 illustrates one potential example of within-wafer metrology. Other types of checks and decisions are also contemplated and may be used in combination with, and/or replace, the detailed checks. For example, an additional check could include whether there is a large change in the recipe parameter that could have affected a specific region; if so, a determination can be made as to whether the change affected the region to the extent that more information is desirable; and if so, more metrology points can be added to the sampling plan.

Figure 4A:
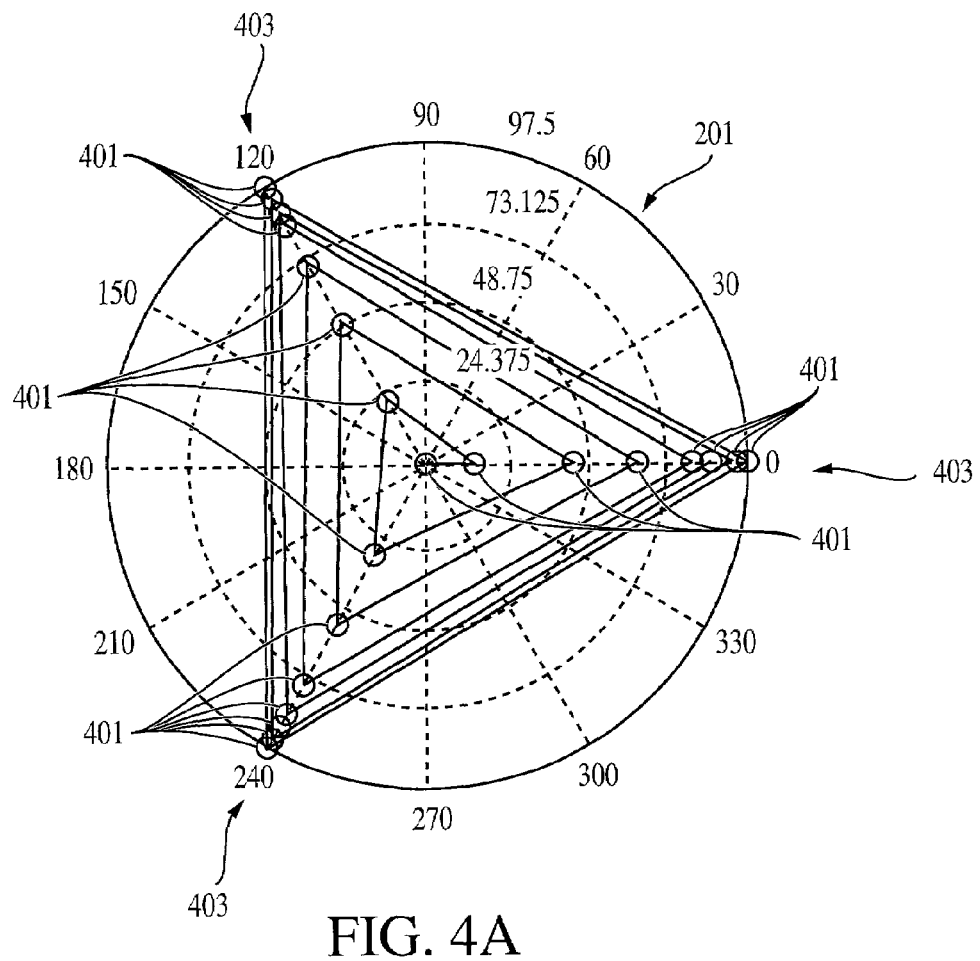
FIGS. 4A and 4B are a spiral sampling plan for a wafer for use with one or more embodiments of the invention, with FIG. 4A being a plan view of the wafer and FIG. 4B being a cross-section of the wafer along a radius of FIG. 4A.
Figure 4B:
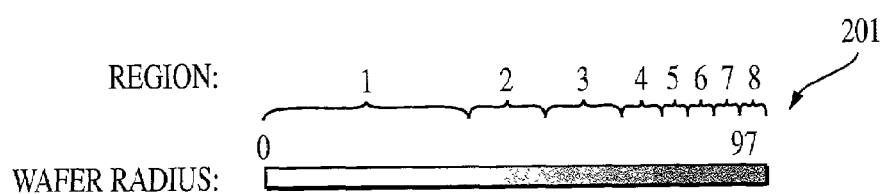

Reference is now made to FIGS. 4A and 4B, illustrating a plan view and sectional view, respectively, of a triangular spiral sampling plan. This is one example of a specific sampling plan, showing specific measurement points 401 in relation to a wafer 201. Other static sampling plans may be used. Nevertheless, the illustrated spiral sampling plan is well adapted to capturing both radial change as well as angular change. Consider polar coordinates, where R is the radius and theta is the angle; the triangular spiral sampling plan can capture variations in both the R direction and the theta direction. If the system can compensate only for variations that are radial, it may be desirable to add measurement points in the radial direction. Even if a significant angular variation was detected, one might not add any measurement points if the variation cannot be corrected anyway due to the manner of holding and/or spinning the wafer in the processing device.

Still referring to the example sampling plan illustrated in FIGS. 4A and 4B, the points 401 are distributed along three splines 403 radiating from the center of the wafer. The points 401 of this example are generally distributed in each of eight regions, shown in FIG. 4B. In this sampling plan one could potentially add points in a radial direction. There could be provided more or fewer regions in other embodiments of the invention. Suppose that in Region 1, which are all points radially from approximately 0 mm to 40 mm, there is a large variation; more measurement points could be added from the die map in order to better characterize that variation. FIG. 4A indicates equidistant radii at 24.375 mm from the center, 48.75 mm, 73.125 mm, and 97.5 mm for purposes of illustration. It should be noted that the distance between points 401 along spline 403 advantageously decreases towards the outer diameter of the wafer, to accommodate the increase in the surface area in relation to the width of the region.

FIGS. 4A and 4B illustrate only one of many potential sampling plans, in this instance a particular spiral sampling plan. Other sampling plans are possible. One advantage of the illustrated spiral sampling plan is that it quantifies not only radial but also angular variation. Another advantage is that it also measures a weighted region, that is it measures a selected number of coordinates in approximate proportion to the wafer surface area that they represent. Closer to the edge of the wafer, measurement points are more dense or closer together, since the radial distance is much further and the area of the region is greater in comparison to the width of the region.

Moreover, the variation on the edge typically will be much higher than variation toward the center of the wafer. The variation tends to increase proportionately further away from the center. As a result, the density of the points to be measured may be advantageously increased as the points move radially outward.

Furthermore, the present invention optionally optimizes the measuring speed of the spiral sampling plan. In performance of metrology, a measurement is faster if performed radially across the wafer. According to the spiral sampling plan contemplated by one or more embodiments of the present invention, the wafer may be rotated approximately 120 degrees subsequent to a linear measurement, and then the next measurement is taken at the next point positioned radially across the wafer; then the wafer is again rotated approximately 120 degrees for the next measurement and so forth. The angle of rotation can be varied to correspond to the disposition of points as well as to accommodate the capabilities and/or limitations of the metrology tool. The wafer may be positioned on a pedestal and rotated and shifted while the metrology tool performs the measurement of the wafer.

Figure 5:
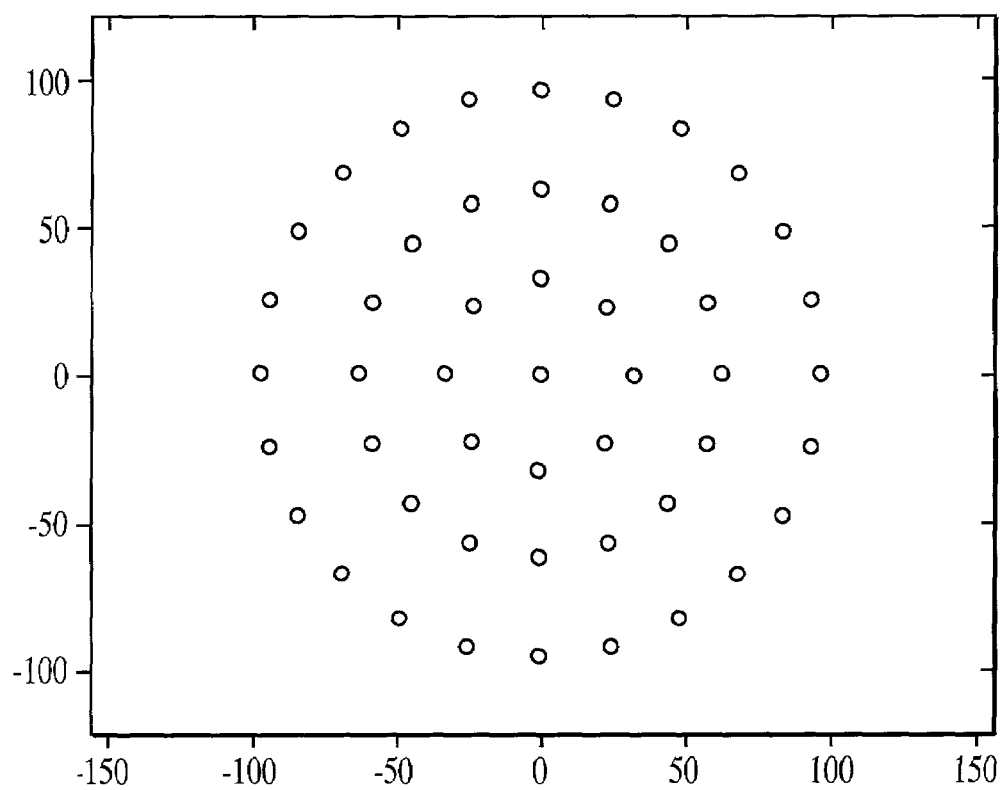
FIG. 5 is an example of another sampling plan for use with one or more embodiments of the invention.

Other sampling plans are also contemplated by one or more embodiments of the present invention, including a sampling plan with a large number of points, such as forty-nine (illustrated in FIG. 5), or a small number of points, such as five. Other sampling plans with other distributions of metrology points, such as distributed in concentric circles or star formations, or other variations may be used in one or more embodiments.

Figure 6:
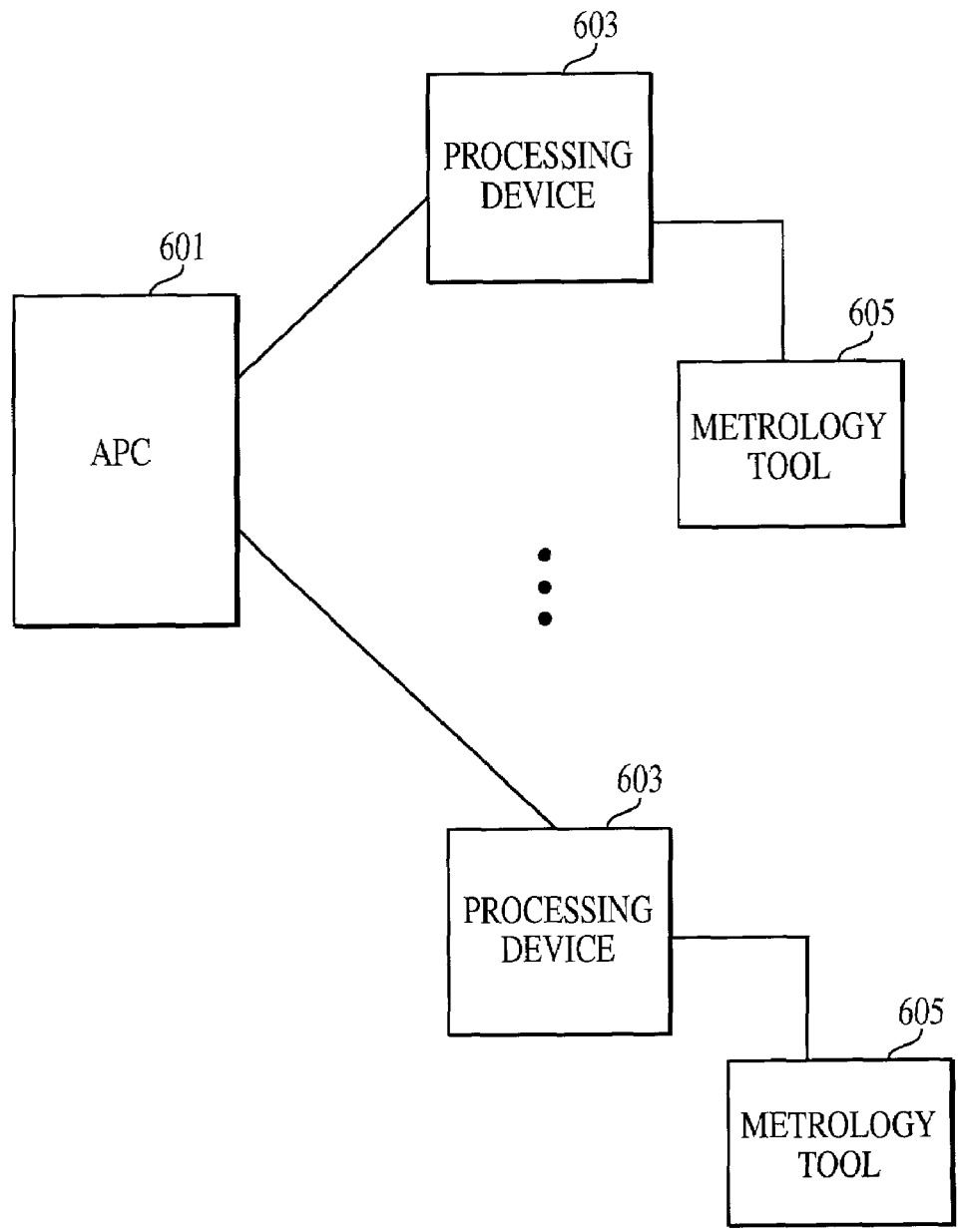
FIG. 6 is a block diagram of a computerized process control system which may be used in connection with one or more embodiments of the present invention.

Reference is made to FIG. 6, illustrating a possible computerized process control system which may be used in connection with one or more embodiments of the present invention. The system includes a standard factory automation system such as an APC 601. The APC 601 provides for central control of, and communication with, one or more standard processing devices 603 or resources. In turn, the processing device 603 communicates with and controls a standard metrology tool 605, which measures wafers in accordance with the processes described in connection with the present invention. Although FIG. 6 illustrates a typical system, other configurations are possible, such as having the metrology device(s) 605 communicate with the APC 601, or even omitting the APC 601 and having the metrology device 605 pattern the processes described herein.

Examples of processing devices that may be used in conjunction with the invention include chemical mechanical planarization (CMP) tools, etch tools, chemical vapor deposition (CVD) tools, lithography tools and others. It should be noted that the processing device may incorporate the metrology tool in some configurations.

While this invention has been described in conjunction with the specific embodiments outlined above, many alternatives, modifications and variations will be apparent to those skilled in the art. Accordingly, the preferred embodiments of the invention as set forth are intended to be illustrative and not limiting. Various changes may be made without departing from the spirit and scope of the invention as defined in the following claims.

For example, it would be possible to use any sampling plan with the invention. A sampling plan may include information in addition to that mentioned above. Further, a sampling plan may combine information from multiple sampling plans. As another example, although the above discusses a pre-determined or static sampling plan, such pre-determined or static sampling plan includes those sets of coordinate points measured on the fly such as just prior to wafer processing.

As another example, events or conditions in addition to, in combination with, and/or replacing these discussed above, could be checked as part of the wafer-to-wafer metrology determination. For example, a metrology tool, a processing device, or the system itself could indicate a fault. Moreover, it is possible that the reason for the fault could be indicated, and such information could be specifically checked and appropriately handled as well. The system could check for changes to the recipe in several different ways, such as replacement of a recipe, or change in recipe parameters.

Similarly, other events or conditions could be handled as part of the within-wafer determination. For example, there may be one or more regions of any shape on the wafer. As another example, points could be omitted from the sampling plan in appropriate cases. A further example includes other events mentioned above in connection with wafer-to-wafer processing.

As another example, the factory automation system may be a general purpose computer, or a specially programmed special purpose computer. It may also be implemented as a distributed computer system rather than as a single computer; some of the distributed system might include embedded systems. Further, the programming may be distributed among processing devices and metrology tools or other parts of the process control system. Similarly, the processing could be controlled by a software program on one or more computer systems or processors, or could be partially or wholly implemented in hardware. Moreover, the factory automation system may communicate directly or indirectly with the relevant metrology tool(s), processing devices, and metrology system(s); or the metrology tool(s), processing devices and metrology system(s) may communicate directly or indirectly with each other and the factory automation system.

What is claimed is:

1. A computer-implemented method of measuring at least one manufacturing characteristic for at least one wafer from a lot of wafers processed by a process control system, comprising:
   providing information representative of a set of candidate points to be measured by the process control system on the at least one wafer from the lot of wafers;
   executing, by the process control system, a plan for the lot of wafers for performing measurements on the at least one wafer to measure the at least one manufacturing characteristic, the plan defining the measurements to be made responsive to the set of candidate points;
   detecting, by the process control system, that one of a plurality of events indicating a change in a manufacturing process occurs while processing the lot of wafers, or that a lack of one of the plurality of events occurs while processing the lot of wafers, the plurality of events comprising an occurrence of a fault in a processing device used to process the lot of wafers, and an occurrence of a variation in a measurement of a previously measured wafer from the lot of wafers;
   determining, by the process control system while processing the lot of wafers, whether to measure the at least one wafer from the lot of wafers based on the detected event or lack of the event; and
   adjusting the plan, by the process control system while processing the lot of wafers, to measure the at least one wafer from the lot of wafers and to refrain from measuring the at least one wafer from the lot of wafers based on the detected event or lack of the event.

2. The method of claim 1, wherein the manufacturing process is an automated semi-conductor manufacturing process.

3. The method of claim 1, wherein the plan further includes information representative of a metrology recipe.

4. The method of claim 1, wherein the candidate points are included in a map corresponding to the at least one wafer.

5. The method of claim 1, wherein the plan is a pre-determined sampling plan.

6. The method of claim 5, wherein at least one of: the sampling plan comprises a plurality of splines radiating from a center of the at least one wafer, and wherein the candidate points are distributed along the splines.

7. The method of claim 6, wherein a distribution of the candidate points along the splines is weighted according to a surface area of the at least one wafer.

8. The method of claim 5, wherein the sampling plan includes a plurality of radially distributed candidate points.

9. The method of claim 1, wherein the plan defines at least one region on the wafer, each of the candidate points corresponding to the at least one region.

10. The method of claim 1, wherein adjusting the plan comprises:
    selecting at least one measurement responsive to the candidate points for the at least one wafer;
    assigning the selected at least one measurement as an additional measurement to be performed or as a measurement to be removed under the plan; and
    revising at least one of the measurements, the selected measurement, and the plan.

11. The method of claim 1, wherein adjusting the plan comprises:
    determining whether the detected event or the lack of the event may affect a series of wafers from the lot of wafers; and
    determining whether to measure at least one of the wafers in the series of wafers based on the determination of whether the series of wafers may be affected.

12. The method of claim 11, wherein there is provided a plurality of wafers in a group, including the at least one wafer, and wherein the plan further comprises:
    first information representative of the wafers in the group that are available to be measured; and
    second information representative of the wafers in the group that are to be measured under the plan.

13. The method of claim 1, further comprising discarding information representative of measurement results on the at least one wafer when at least one of: the measurement results indicate a variation in measurement of the at least one wafer, and a fault is detected in the processing device used to process the lot of wafers.

14. The method of claim 1, wherein the plan comprises:
    a plurality of splines radiating from a center of the at least one wafer, the candidate points being distributed along the splines; and
    a distribution of the candidate points along the splines weighted according to a surface area of the at least one wafer.

15. A computer-implemented system of measuring at least one manufacturing characteristic for at least one wafer from a lot of wafers processed by a process control system, comprising:
    a memory to store information representative of a set of candidate points to be measured by the process control system on the at least one wafer from the lot of wafers, and information representative of a plan for the lot of wafers for performing measurements on the at least one wafer to measure the at least one manufacturing characteristic, the plan defining the measurements to be made responsive to the set of candidate points; and
    a processor, coupled to the memory, to
       detect that one of a plurality of events indicating a change in a manufacturing process occurs while processing the lot of wafers, or that a lack of one of the plurality of events occurs while processing the lot of wafers, the plurality of events comprising an occurrence of a fault in a processing device used to process the lot of wafers, and an occurrence of a variation in a measurement of a previously measured wafer from the lot of wafers;

determine, while processing the lot of wafers, whether to measure the at least one wafer from the lot of wafers based on the detected event or lack of the event; and adjust the plan, while processing the lot of wafers, to measure the at least one wafer from the lot of wafers and to refrain from measuring the at least one wafer from the lot of wafers based on the detected event or lack of the event.

16. The system of claim 15, wherein the manufacturing process is an automated semi-conductor manufacturing process, further comprising at least one metrology tool for performing measurements on the wafer, operatively connected to the processor.

17. The system of claim 15, wherein the plan further includes information representative of a metrology recipe.

18. The system of claim 15, wherein the candidate points are included in a map corresponding to the at least one wafer.

19. The system of claim 15, wherein the plan is a pre-determined sampling plan.

20. The system of claim 19, wherein at least one of: the sampling plan includes a plurality of splines radiating from a center of the at least one wafer, and wherein the candidate points are distributed along the splines.

21. The system of claim 20, wherein a distribution of the candidate points along the splines is weighted according to a surface area of the at least one wafer.

22. The system of claim 15, wherein the sampling plan includes a plurality of radially distributed candidate points.

23. The system of claim 15, wherein the plan defines at least one region on the wafer, each of the candidate points corresponding to the at least one region.

24. The system of claim 15, wherein to adjust the plan comprises:

selecting at least one measurement responsive to the candidate points for the at least one wafer;

assigning the selected at least one measurement as an additional measurement to be performed or as a measurement to be removed under the plan; and revising at least one of the measurements, the selected measurement, and the plan.

25. The system of claim 15, wherein to adjust the plan comprises:

determining whether the detected event or the lack of the event may affect a series of wafers from the lot of wafers; and determining whether to measure at least one of the wafers in the series of wafers based on the determination of whether the series of wafers may be affected.

26. The system of claim 25, wherein there is provided a plurality of wafers in a group, including the at least one wafer, and wherein the plan further comprises:

first information representative of the wafers in the group that are available to be measured; and second information representative of the wafers in the group that are to be measured under the plan.

27. The system of claim 15, wherein the memory is further to store information representative of measurement results on the at least one wafer, except when at least one of: the measurement results indicate a variation in measurement of the at least one wafer, and when a fault is detected in the processing device used to process the lot of wafers.

28. The system of claim 15, wherein the plan comprises:

a plurality of splines radiating from a center of the at least one wafer, the candidate points being distributed along the splines; and a distribution of the candidate points along the splines weighted according to a surface area of the at least one wafer.

29. A computer readable medium for measuring at least one manufacturing characteristic for at least one wafer from a lot of wafers processed by a process control system, comprising executable instructions which when executed on a processing system cause the processing system to perform a method comprising:

providing information representative of a set of candidate points to be measured by the process control system on the at least one wafer from the lot of wafers;

executing, by the process control system, a plan for the lot of wafers for performing measurements on the at least one wafer to measure the at least one manufacturing characteristic, the plan defining the measurements to be made responsive to the set of candidate points;

detecting, by the process control system, that one of a plurality of events indicating a change in a manufacturing process occurs while processing the lot of wafers, or that a lack of one of the plurality of events occurs while processing the lot of wafers, the plurality of events comprising an occurrence of a fault in a processing device used to process the lot of wafers, and an occurrence of a variation in a measurement of a previously measured wafer from the lot of wafers determining, by the process control system while processing the lot of wafers, whether to measure the at least one wafer from the lot of wafers based on the detected event or lack of the event; and adjusting the plan, by the process control system while processing the lot of wafers, to measure the at least one wafer from the lot of wafers and to refrain from measuring the at least one wafer from the lot of wafers based on the detected event or lack of the event.

30. The computer readable medium of claim 29, wherein the manufacturing process is an automated semi-conductor manufacturing process.

31. The computer readable medium of claim 29, wherein the plan further includes information representative of a metrology recipe.

32. The computer readable medium of claim 29, wherein the candidate points are included in a map corresponding to the at least one wafer.

33. The computer readable medium of claim 29, wherein the plan is a pre-determined sampling plan.

34. The computer readable medium of claim 33, wherein at least one of: the sampling plan includes a plurality of splines radiating from a center of the at least one wafer, and wherein the candidate points are distributed along the splines.

35. The computer readable medium of claim 34, wherein a distribution of the candidate points along the splines is weighted according to a surface area of the at least one wafer.

36. The computer readable medium of claim 33, wherein the sampling plan includes a plurality of radially distributed candidate points.

37. The computer readable medium of claim 29, wherein the plan defines at least one region on the wafer, each of the candidate points corresponding to the at least one region.

38. The computer readable medium of claim 29, wherein adjusting the plan comprises:

selecting at least one measurement responsive to the candidate points for the at least one wafer;

assigning the selected at least one measurement as an additional measurement to be performed or as a measurement to be removed under the plan; and revising at least one of the measurements, the selected measurement, and the plan.

39. The computer readable medium of claim 29, wherein adjusting the plan comprises:

determining whether the detected event or the lack of the event may affect a series of wafers; and determining whether to measure at least one of the wafers in the series of wafers based on the determination of whether the series of wafers may be affected.

40. The computer readable medium of claim 39 wherein there is provided a plurality of wafers in a group, including the at least one wafer, and wherein the plan further comprises:

first information representative of the wafers in the group that are available to be measured; and second information representative of the wafers in the group that are to be measured under the plan.

41. The computer readable medium of claim 29, further comprising instructions for discarding information representative of measurement results on the at least one wafer when at least one of: the measurement results indicate a variation in measurement of the at least one wafer, and when a fault is detected in the processing device used to process the lot of wafers.

42. The computer readable medium of claim 29, wherein the plan comprises:

a plurality of splines radiating from a center of the at least one wafer, the candidate points being distributed along the splines; and a distribution of the candidate points along the splines weighted according to a surface area of the at least one wafer.

43. A computer-implemented system of measuring at least one manufacturing characteristic for at least one wafer from a lot of wafers processed by a process control system, comprising:

means for representing a set of candidate points to be measured by the process control system on the at least one wafer from the lot of wafers;

means for providing a plan for the lot of wafers for performing measurements on the at least one wafer to measure the at least one manufacturing characteristic, the plan defining the measurements to be made responsive to the set of candidate points;

means for detecting that one of a plurality of events indicating a change in a manufacturing process occurs while processing the lot of wafers, or that a lack of one of the plurality of events occurs while processing the lot of wafers, the plurality of events comprising an occurrence of a fault a processing device used to process the lot of wafers, and an occurrence of a variation in a measurement of a previously measured wafer from the lot of wafers;

means for determining, while processing the lot of wafers, whether to measure the at least one wafer from the lot of wafers based on the detected event or lack of the event; and means for adjusting the plan, while processing the lot of wafers, to measure the at least one wafer from the lot of wafers and to refrain from measuring the at least one wafer from the lot of wafers based on the detected event or lack of the event.

44. The system of claim 43, wherein the manufacturing process is an automated semi-conductor manufacturing process, further comprising at least means for performing measurements on the wafer.

45. The system of claim 43, wherein the plan further includes information representative of a metrology recipe.

46. The system of claim 43, wherein the candidate points are included in a map corresponding to the at least one wafer.

47. The system of claim 43, wherein the plan is a predetermined sampling plan.

48. The system of claim 47, wherein at least one of: the sampling plan includes a plurality of splines radiating from a center of the at least one wafer, and wherein the candidate points are distributed along the splines.

49. The system of claim 48, wherein a distribution of the candidate points along the splines is weighted according to a surface area of the at least one wafer.

50. The system of claim 43, wherein the sampling plan includes a plurality of radially distributed candidate points.

51. The system of claim 43, wherein the plan defines at least one region on the wafer, each of the candidate points corresponding to the at least one region.

52. The system of claim 43, wherein the means for adjusting the plan comprises:

selecting at least one measurement responsive to the candidate points for the at least one wafer;

assigning the selected at least one measurement as an additional measurement to be performed or as a measurement to be removed under the plan; and revising at least one of the measurements, the selected measurement, and the plan.

53. The system of claim 43, wherein the means for adjusting the plan comprises:

determining whether the detected event or the lack of the event may affect a series of wafers; and determining whether to measure at least one of the wafers in the series of wafers based on the determination of whether the series of wafers may be affected.

54. The system of claim 53, wherein there is provided a plurality of wafers in a group, including the at least one wafer, and wherein the plan further comprises:

first information representative of the wafers in the group that are available to be measured; and second information representative of the wafers in the group that are to be measured under the plan.

55. The system of claim 43, further comprising means for representing measurement results on the at least one wafer, except when at least one of: the measurements results indicate a variation in measurement of the at least one wafer, and when a fault is detected in the processing device used to process the lot of wafers.

56. The system of claim 43, wherein the plan comprises:

a plurality of splines radiating from a center of the at least one wafer, the candidate points being distributed along the splines; and a distribution of the candidate points along the splines weighted according to a surface area of the at least one wafer.

\* \* \* \* \*